United States Patent
Kim et al.

(10) Patent No.: US 9,865,496 B2
(45) Date of Patent: Jan. 9, 2018

(54) METHOD FOR MANUFACTURING ISOLATION STRUCTURE

(71) Applicant: SK hynix Inc., Gyeonggi-do (KR)

(72) Inventors: Eun-Jeong Kim, Gyeonggi-do (KR); Jin-Yul Lee, Gyeonggi-do (KR); Han-Sang Song, Gyeonggi-do (KR); Su-Ho Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/236,173

(22) Filed: Aug. 12, 2016

(65) Prior Publication Data
US 2017/0186642 A1    Jun. 29, 2017

(30) Foreign Application Priority Data
Dec. 23, 2015 (KR) .................. 10-2015-0184820

(51) Int. Cl.
*H01L 21/762* (2006.01)
*H01L 21/02* (2006.01)

(52) U.S. Cl.
CPC .. *H01L 21/76229* (2013.01); *H01L 21/02164* (2013.01); *H01L 21/02211* (2013.01); *H01L 21/02238* (2013.01); *H01L 21/02362* (2013.01); *H01L 21/76224* (2013.01)

(58) Field of Classification Search
CPC ......... H01L 21/76229; H01L 21/76224; H01L 21/02362; H01L 21/02238; H01L 21/02211; H01L 21/02164

USPC .......................................................... 438/427
See application file for complete search history.

(56) References Cited

U.S. PATENT DOCUMENTS

| | | | |
|---|---|---|---|
| 8,133,797 B2* | 3/2012 | van Schravendijk | C23C 16/045 257/E21.548 |
| 8,685,832 B2 | 4/2014 | Watanabe | |
| 2009/0162989 A1* | 6/2009 | Cho | H01L 21/76232 438/427 |
| 2009/0191687 A1* | 7/2009 | Hong | H01L 21/76232 438/423 |
| 2014/0312455 A1 | 10/2014 | Park | |
| 2015/0357232 A1* | 12/2015 | Ujihara | H01L 21/76229 438/427 |

* cited by examiner

*Primary Examiner* — Selim Ahmed
(74) *Attorney, Agent, or Firm* — IP & T Group LLP

(57) ABSTRACT

A method for manufacturing a semiconductor device includes forming a first trench and a second trench in a substrate, the first and the second trenches communicate with each other, the second trench may be formed wider than the first trench; forming a liner layer over an inner surface of the first trench and over an inner surface of the second the trench; forming a capping layer over the liner layer to form a merged overhang and a non-merged overhang, the merged overhang may be fill a top portion of the first trench, the non-merged overhang may be open a top portion of the second trench; and forming a gap-fill layer over the capping layer to fill a lower portion of the first trench and the second trench.

20 Claims, 20 Drawing Sheets

METHOD FOR MANUFACTURING ISOLATION STRUCTURE

CROSS-REFERENCE TO RELATED APPLICATION

This application claims priority under 35 U.S.C. §119 to Korean Patent Application No. 10-2015-0184820 filed on Dec. 23, 2015, the disclosure of which is herein incorporated by reference in its entirety.

TECHNICAL FIELD

Exemplary embodiments relate to a semiconductor device, and more particularly, to an isolation structure and a method for manufacturing the same.

DISCUSSION OF THE RELATED ART

As a semiconductor device is highly integrated, an isolation structure with a smaller width is demanded. The isolation structure may be formed by forming a trench in a substrate and filling a dielectric layer in the trench. An active region may be defined by the isolation structure.

However, as a critical dimension or a pattern size of the active region decreases, a leaning phenomenon or a bending phenomenon occurs in the active region.

SUMMARY

Various embodiments are directed to an isolation structure capable of preventing a leaning phenomenon and a bending phenomenon, a method for manufacturing the same, and a method for manufacturing a semiconductor device including the same.

In an embodiment, a method for manufacturing a semiconductor device may include: forming a first trench and a second trench in a substrate, the first and the second trenches communicate with each other, the second trench may be formed wider than the first trench; forming a liner layer over an inner surface of the first trench and over an inner surface of the second the trench; forming a capping layer over the liner layer to form a merged overhang and a non-merged overhang, the merged overhang may be fill a top portion of the first trench, the non-merged overhang may be open a top portion of the second trench; and forming a gap-fill layer over the capping layer to fill a lower portion of the first trench and the second trench. The merged overhang may be define a first gap in the lower portion of the first trench, the non-merged overhang may be define a second gap in the second trench, the first and the second gaps communicate with each other, and the gap-fill layer may be fill the first and the second gaps and extend from the second gap to the first gap. The method may further include: planarizing the gap-fill layer and the capping layer to form an isolation structure in the first and the second trenches, the planarized gap-fill layer may include a first planarized gap-fill layer disposed in the first trench and a second planarized gap-fill layer disposed in the second trench, the first planarized gap-fill layer may be completely covered by the merged overhang, and the second planarized gap-fill layer may be formed over a top sidewall of the first trench. The capping layer may be formed by plasma-enhanced chemical vapor deposition (PECVD) or low temperature atomic layer deposition (ALD). The capping layer may include an oxide-base material. The forming of the liner layer may include forming a seed silicon layer over the inner surface of the first trench and over the inner surface of the second trench; and forming an amorphous silicon layer over the seed silicon layer. The method may further include, after the forming of the liner layer, converting the liner layer into a silicon oxide layer. The converting of the liner layer into the silicon oxide layer may be performed by radical oxidation or dry oxidation. The forming of the liner layer may include forming a first oxide layer over the inner surface of the first trench and over the inner surface of the second trench; performing an oxidation process to form a second oxide layer between the inner surfaces of the first and the second trenches and the first oxide layer. The oxidation process may be performed by radical oxidation or dry oxidation. The forming of the gap-fill layer may include: forming a first dielectric layer over the capping layer, the first dielectric layer substantially completely fill the first the trench and partially fill the second trench; and forming a second dielectric layer over the first dielectric layer to fill the second trench. The first dielectric layer may include nitride, and the second dielectric layer may include oxide. Each of the first dielectric layer and the second dielectric layer may include nitride. The method may further include planarizing the gap-fill layer and the capping layer to form an isolation structure in the first and the second trenches, the isolation structure defining active regions; forming a gate trench that extend across the isolation structure and the active regions; forming a gate dielectric layer over an inner surface of the gate trench; forming a gate layer over the gate dielectric layer to fill the gate trench; recessing the gate layer to form a gate electrode so that the gate electrode remains in the gate trench; and forming a gate capping layer over the gate electrode and in the gate trench. The method may further include recessing the isolation structure under the gate trench to form a fin region. The forming of the gate dielectric layer may include forming a silicon layer over the inner surface of the gate trench; and converting the silicon layer into a silicon oxide layer. The forming of the gate dielectric layer may include forming a silicon nitride layer over the inner surface of the gate trench; and converting the silicon nitride layer into a silicon oxide layer. The forming of the gate dielectric layer may include forming a first silicon oxide layer over the inner surface of the gate trench; and performing an oxidation process to form a second silicon oxide layer between the inner surface of the gate trench and the first silicon oxide layer. The method may further include forming a first contact node and a second contact node in each of the active regions; forming a bit line coupled to the first contact node; and forming a memory element coupled to the second contact node. The first and second trenches may define active regions. The active regions may include a first pair of active regions defined by the first trench and is supported by the merged overhang; and a second pair of active regions defined by the second trench.

In an embodiment, a method for manufacturing a semiconductor device may include: forming a first trench and a second trench to define a plurality of active regions in a substrate, the first and the second trenches communicate with each other, the second trench is formed wider than the first trench; forming a silicon layer over an inner surface of the first trench and over an inner surface of the second trench; forming a first oxide layer over the silicon layer; and performing an oxidation process of the silicon layer and the first oxide layer to form a second oxide layer, the second oxide layer substantially completely fill the first trench. The oxidation process may be performed by radical oxidation. The first oxide layer may include flowable oxide. The first oxide layer may include hydrogen-containing silicon oxide. The silicon layer may include amorphous silicon. The method may further include forming a nitride layer over the second oxide layer so that the nitride layer fills the second trench; planarizing the nitride layer and the second oxide layer to form an isolation structure in the first and the second trenches; forming a gate trench that extends across the isolation structure and the active regions; and forming a gate dielectric layer over an inner surface of the gate trench. The method may further include recessing the isolation structure located under the gate trench to form a fin region. The forming of the gate dielectric layer may include forming a liner silicon layer over the inner surface of the gate trench; and converting the liner silicon layer into a silicon oxide layer. The forming of the gate dielectric layer may include forming a silicon nitride layer over the inner surface of the gate trench; and converting the silicon nitride layer into a silicon oxide layer. The forming of the gate dielectric layer may include forming a first silicon oxide layer over the inner surface of the gate trench, and performing an oxidation process to form a second silicon oxide layer between the inner surface of the gate trench and the first silicon oxide layer. The method may further include forming a gate layer over the gate dielectric layer to fill the gate trench; recessing the gate layer to form a gate electrode in the gate trench; and forming a gate capping layer over the gate electrode and in the gate trench. The method may further include forming a bit line coupled to a first contact node of each of the active regions; and forming a memory element coupled to a second contact node of each of the active regions.

In an embodiment, a semiconductor device may include: a substrate including a trench and a plurality of active regions are defined by the trench, the trench include a first trench and a second trench may be wider than the first trench; a liner lining over inner surfaces of the first and the second trenches; a gap-fill layer formed over the liner to fill the first trench and the second trench; and a capping layer formed between the liner and the gap-fill layer and extending over a top surface of the gap-fill layer to form a merged overhang in the first trench. The gap-fill layer may include a silicon nitride layer. The gap-fill layer may include (i) a silicon nitride layer filling the first trench and covering the second trench; and (ii) a silicon oxide layer which may be formed over the silicon nitride layer to fill the second trench. The gap-fill layer may include (i) a silicon oxide layer filling the first trench and covering the second the trench; and (ii) a silicon nitride layer which may be formed over the silicon oxide layer to fill the second trench. Each of the capping layer and the liner may include silicon oxide. The capping layer may further extend over a top surface of the gap-fill layer to form a non-merged overhang in the second the trench.

DETAILED DESCRIPTION

Figure 1A:
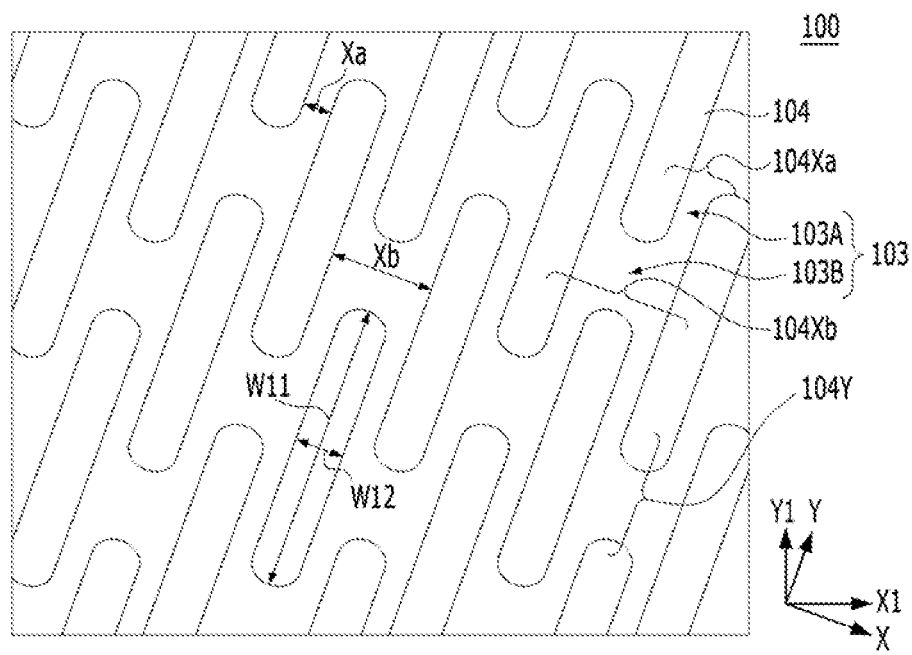
FIGS. 1A and 1B are plan views of a semiconductor device in accordance with a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

Figure 1B:
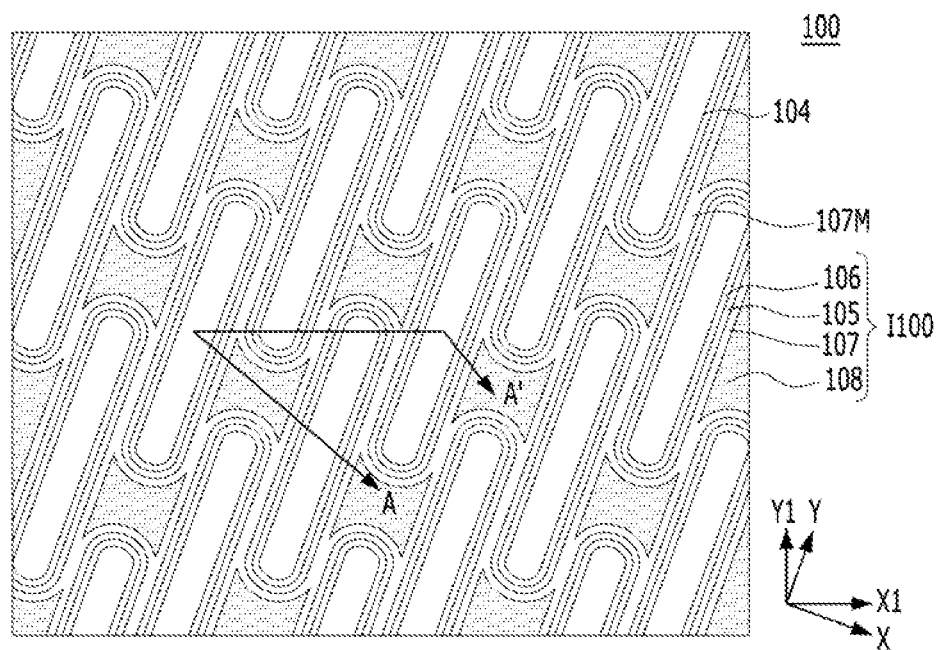
Figure 1C:
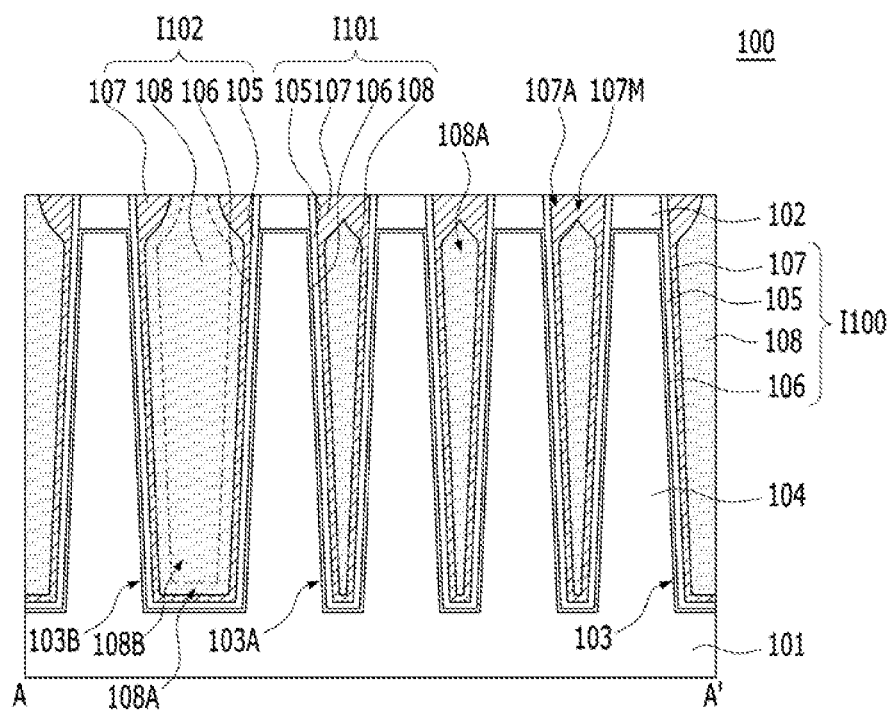
FIG. 1C is a cross-sectional view taken along the line A-A' of FIG. 1B.

FIGS. 1A and 1B are plan views of a semiconductor device in accordance with a first embodiment. FIG. 1A is a detailed view of active regions and trench. FIG. 1B is a plan view of a semiconductor device formed with an isolation structure. FIG. 1C is a cross-sectional view taken along the line A-A' of FIG. 1B.

Referring to FIGS. 1A to 1C, a semiconductor device 100 may include a substrate 101. An isolation structure I100 that defines a plurality of active regions 104 may be formed in the substrate 101.

The plurality of active regions 104 may be defined as an island shape or a bar shape. Each of the plurality of active regions 104 may have a minor axis in a first direction X and a major axis in a second direction Y. The major axis may have a first width W11, and the minor axis may have a second width W12. The plurality of active regions 104 may be repetitively formed in the state in which they are separated from one another in the first direction X and the second direction Y. Among the plurality of active regions 104, a pair of active regions 104Y that neighbor each other in the second direction Y may be arranged so that only portions of them overlap with each other in the second direction Y.

The first direction X and the second direction Y may be perpendicular to each other. The plurality of active regions 104 may be inclined obliquely with respect to a third direction X1 and a fourth direction Y1. The third direction X1 and the fourth direction Y1 may be perpendicular to each other. Active regions 104 that neighbor in the first direction X may have a first spacing Xa and a second spacing Xb. The first spacing Xa may be smaller than the second spacing Xb. A hard mask layer 102 may be formed on the active regions 104.

The isolation structure I100 may be formed in trench 103. The trench 103 may be formed by etching the substrate 101 using the hard mask layer 102. The trench 103 may include a plurality of first trenches 103A and a plurality of second trenches 103B that are wider than the first trenches 103A. The first trenches 103A may have the first spacing Xa, and the second trenches 103B may have the second spacing Xb. The first trenches 103A may be define a first pair of active regions 104Xa in the first direction X. The second trenches 103B may be define a second pair of active regions 104Xb in the first direction X.

The isolation structure I100 may include a liner and a gap-fill layer 108. The liner may include a second oxide liner 105 and a first oxide liner 106. The isolation structure I100 may include a plurality of first portions I101 and a plurality of second portions I102. The first portions I101 of the isolation structure I100 may be formed in the first trenches 103A. The second portions I102 of the isolation structure I100 may be formed in the second trenches 103B. The first portions I101 and the second portions I102 of the isolation structure I100 may be continuous and communicate with each other.

The first portions I101 and the second portions I102 of the isolation structure I100 may be formed of the same material. For example, the first trenches 103A and the second trenches 103B may be lined with the first oxide liner 106 and the second oxide liner 105, and the first trenches 103A and the second trenches 103B of the lined trench 103 may be fully filled with the gap-fill layer 108. The first oxide liner 106 and the second oxide liner 105 may include silicon oxide. In this way, the isolation structure I100 may be a dual oxide liner structure.

The isolation structure I100 may further include a capping layer 107. The capping layer 107 may be formed between the second oxide liner 105 and the gap-fill layer 108. The capping layer 107 may conformally cover the bottom and sidewalls of the trench 103 and on the second oxide liner 105. The capping layer 107 may include overhangs 107A that are positioned at the tops of the sidewalls of the trench 103. Due to the overhangs 107A, the capping layer 107 may have merged portions 107M. The merged portions 107M may be a portion that is formed as the overhangs 107A of the capping layer 107 contact each other and thereby shield the entrance of the trench 103, in particular, the first trenches 103A. The overhangs 107A may be formed even in the second trenches 103B. The merged portions 107M are not formed in the second trenches 103B. The capping layer 107 may include a silicon oxide.

The first portions I101 of the isolation structure I100 may be narrower than the second portions I102. The gap-fill layer 108 formed in the first portions I101 of the isolation structure I100 may be narrower in width than the gap-fill layer 108 formed in the second portions I102. The gap-fill layer 108 may include silicon oxide, silicon nitride, or a combination thereof. The gap-fill layer 108 may include a first dielectric layer 108A and a second dielectric layer 108B. The first dielectric layer 108A completely fills the first trench 103A and partially fills the second trench 103B. The second dielectric layer 108B fills the second trench 103B over the first dielectric layer 108A. The first dielectric layer 108A may include silicon nitride, and the second dielectric layer 108B may include silicon oxide. In another embodiment, the first dielectric layer 108A and the second dielectric layer 108B may include silicon nitride.

According to the above descriptions, the isolation structure I100 may include the capping layer 107, in particular, the merged portions 107M and the overhangs 107A, and thereby, may prevent bending and leaning of the active regions 104.

FIGS. 2A to 2F illustrate a method for manufacturing the semiconductor device in accordance with the first embodiment. FIGS. 2A to 2F show the cross-sections taken along the line A-A' of FIG. 1B.

Figure 2A:
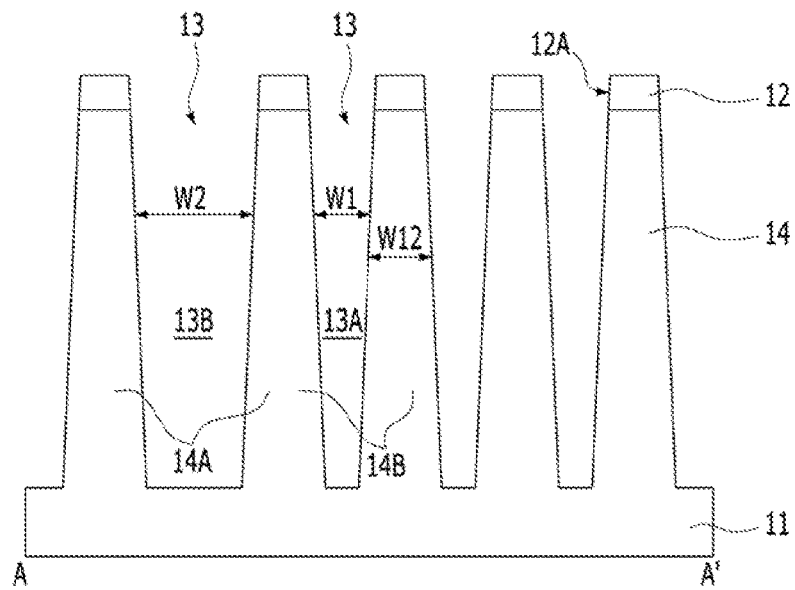
FIGS. 2A to 2F illustrate a method for manufacturing the semiconductor device in accordance with the first embodiment.

As shown in FIG. 2A, trench 13 may be formed. One or more trench 13 may be formed in a substrate 11. The trench 13 may include a plurality of first trenches 13A and a plurality of second trenches 13B. The first trenches 13A and the second trenches 13B may have a first width W1 and a second width W2, respectively. The first width W1 may be smaller than the second width W2. The first width W1 and the second width W2 may correspond to the first spacing Xa and the second spacing Xb, respectively, of FIG. 1A.

By the first trenches 13A and the second trenches 13B, a plurality of active regions 14 may be defined. Each active region 14 may have a third width W12. The third width W12 may be the width measured along the minor axis of the active region 14 (see FIG. 1A). The first trenches 13A may be define a first pair of active regions 14A. The second trenches 13B may be define a second pair of active regions 14B. To form the trench 13, a hard mask layer 12 may be formed on the substrate 11. The hard mask layer 12 may include openings 12A. The openings 12A may define the trench 13.

The substrate 11 may include a semiconductor substrate. The substrate 11 may be a material that contains silicon, that is, a silicon-base material. The substrate 11 may be a silicon substrate, a silicon germanium substrate or a silicon-on-insulator (SOI) substrate. The hard mask layer 12 may include a material that has an etching selectivity with respect to the substrate 11. The hard mask layer 12 may include oxide, nitride, or a combination thereof. For example, the hard mask layer 12 may include silicon oxide such as tetra-ethyl-ortho-silicate (TEOS).

Figure 2B:
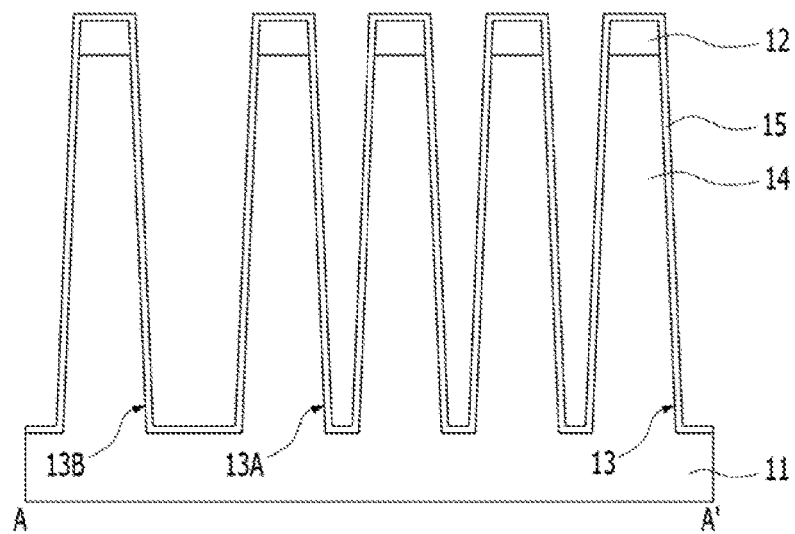

As shown in FIG. 2B, a liner layer 15 may be formed. The liner layer 15 may be formed conformally on the substrate 11. The liner layer 15 may line the bottom and sidewalls of the trench 13. Additionally, the liner layer 15 may cover the sidewalls and top surface of the hard mask layer 12. The liner layer 15 may minimize oxidation of the sidewalls of the active regions 14 during a subsequent oxidation process. The liner layer 15 may include an oxide layer. The liner layer 15 may be formed as a high temperature oxide (HTO) layer. The high temperature oxide (HTO) layer refers to an oxide layer that is deposited at a high temperature. The liner layer 15 may be a high temperature silicon oxide layer.

The liner layer 15 according to the present embodiment may have excellent step coverage. The trench 13 formed with the liner layer 15 may be referred to as a 'lined trench.'

Figure 2C:
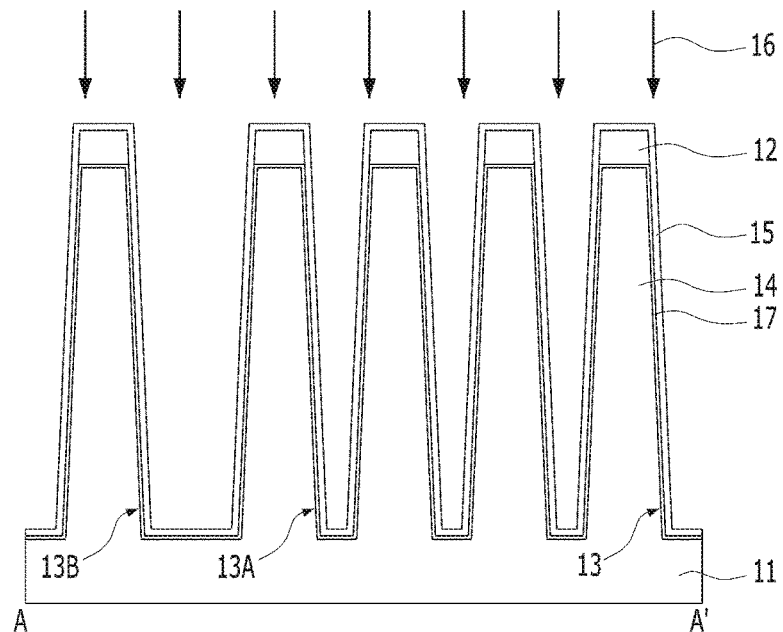

As shown in FIG. 2C, an oxidation process 16 may be performed. The trench 13 formed with the liner layer 15 may be exposed to the oxidation process 16. Due to the oxidation process 16, etch damage caused in the process of forming the trench 13 may be cured. An oxide layer 17 may be formed by the oxidation process 16. The oxidation process 16 and the process of depositing the liner layer 15 may be performed in situ, that is, without a break or interruption. Due to the liner layer 15, oxidation of the sidewalls of the active regions 14 may be minimized. That is, oxidation on the sidewalls of the trench 13 may be minimized. Thus, loss of silicon may be minimized.

In the oxidation process 16, since oxygen passes through the liner layer 15 and is coupled with silicon on the sidewalls of the trench 13, the oxide layer 17 may be formed to a thin thickness in comparison with a sidewall oxide that is formed by performing a direct oxidation process in the state in which the trench 13 are formed. Since loss of silicon on the sidewalls of the trench 13 is minimized, substantial loss of the sidewalls of the active regions 14 does not occur. Accordingly, the active regions 14 may retain substantially a critical dimension.

The oxide layer 17 may be thinner than the liner layer 15. Since the liner layer 15 is formed in advance, even though the oxide layer 17 is formed by the oxidation process 16, the inner spaces of the trench 13 may not be narrowed substantially.

The oxide layer 17 may be silicon oxide. The oxide layer 17 may also be formed at the interface of the hard mask layer 12 and the active regions 14.

The oxidation process 16 for forming the oxide layer 17 may be performed using a radical oxidation process to suppress loss of the sidewalls of the active regions 14. In another embodiment, the oxidation process 16 may be performed using a dry oxidation process under an oxygen atmosphere.

The trench 13 formed with the oxide layer 17 and the liner layer 15 may be referred to as lined trench. The liner layer 15 and the oxide layer 17 may be collectively referred to as an oxide liner.

Figure 2D:
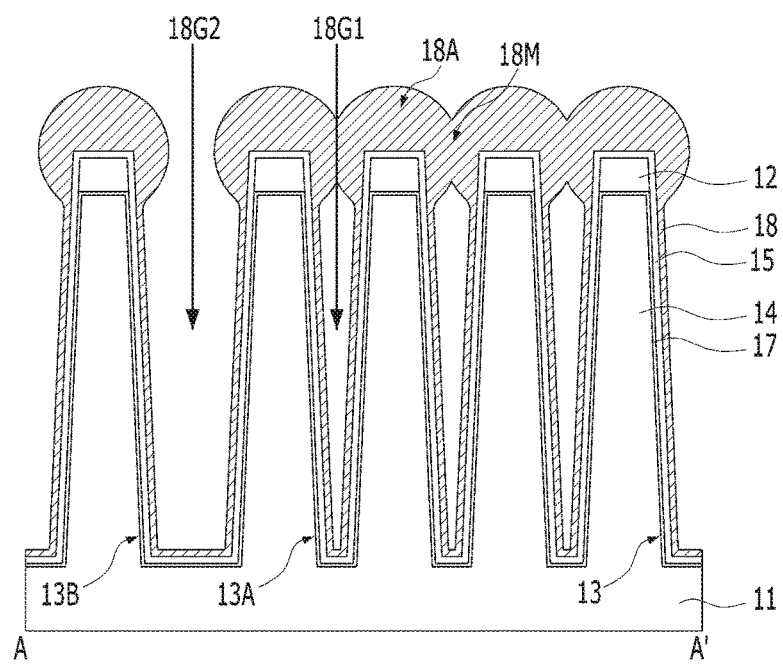

As shown in FIG. 2D, a capping layer 18 may be formed on the liner layer 15. The capping layer 18 may have poor step coverage. That is, a thickness at the tops of the trench 13, a thickness at the sidewalls of the trench 13 and a thickness at the bottom surfaces of the trench 13 may be different from one another. Due to such poor step coverage, overhangs 18A may be formed at the tops of the trench 13. Furthermore due to the overhangs 18A, the capping layer 18 may have merged portions 18M. Each merged portion 18M may be a portion that is formed as the overhangs 18A of the capping layer 18 contact each other and thereby shield the entrance of the trench 13, in particular, the first trenches 13A.

The overhangs 18A may be formed even in the second trenches 13B. The merged portions 18M are not formed in the second trenches 13B. Since the second trenches 13B are wider than the first trenches 13A, the overhangs 18A are formed in the second trenches 13B and the merged potion 18M is not formed in the second trenches 13B.

Gaps 18G1, 18G2 may be formed by the overhangs 18A and the merged portions 18M of the capping layer 18. The gap 18G1 formed in the first trenches 13A may be narrower than the gap 18G2 formed in the second trenches 13B. The gap 18G2 formed in the second trenches 13B may be exposed to an outside. The gap 18G1 formed in the first trenches 13A may be covered by the merged portions 18M. The gaps 18G2 may extend from the inside of the second trenches 13B to the inside of the first trenches 13A (as currently amended).

The top portions of the active regions 14 may be protected by the overhangs 18A and the merged portions 18M. In more detail, the sidewalls of the top portions of neighboring active regions 14 may be supported by the overhangs 18A and the merged portions 18M. The overhangs 18A and the merged portions 18M may be used as supports for neighboring active regions 14, during a subsequent gapfill process. Due to the gaps 18G2 formed in the second trenches 13B, paths for the subsequent gapfill process may be secured. The gaps 18G2 formed in the second trenches 13B may be an open type and may extend to the gaps 18G1 formed in the first trenches 13A under the merged portions 18M. The gaps 18G1 formed in the first trenches 13A may be a closed type by the merged portions 18M.

The capping layer 18 may be formed of oxide. To form the capping layer 18 that has the overhangs 18A and the merged portions 18M, plasma-enhanced chemical vapor deposition (PECVD) may be applied. The capping layer 18 may be formed of silane (SiH$_4$)-base silicon oxide. In another embodiment, the capping layer 18 may be deposited by atomic layer deposition (ALD). In the case in which atomic layer deposition is applied, in order to induce poor step coverage, the capping layer 18 may be deposited at a low temperature.

Figure 2E:
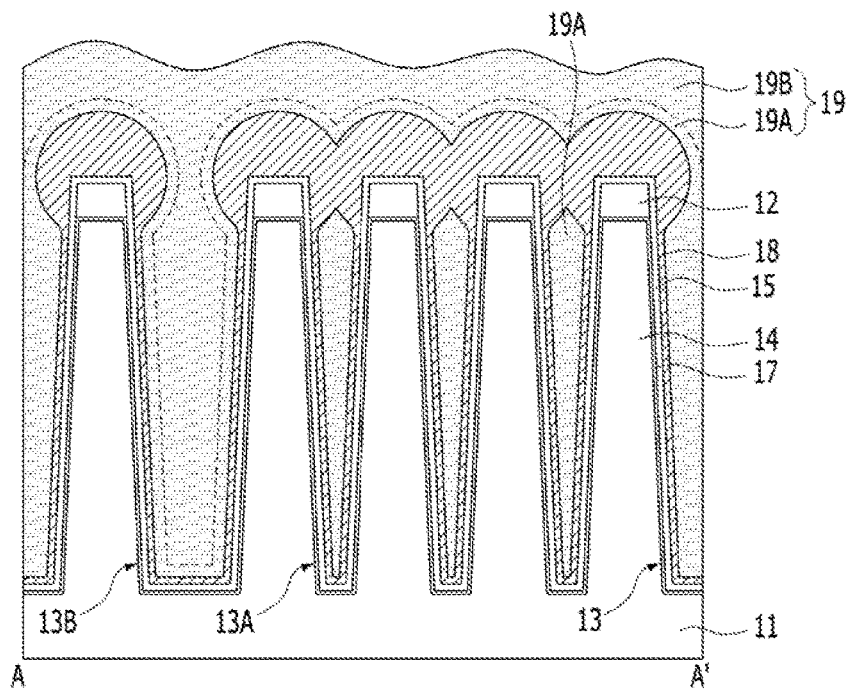

As shown in FIG. 2E, a gapfill process may be performed. For example, a gap-fill layer 19 may be formed on the capping layer 18. The gaps 18G1, 18G2 may be filled with the gap-fill layer 19. Accordingly, the gap-fill layer 19 may concurrently fill in the first trenches 13A and the second trenches 13B. The gap-fill layer 19 may include oxide, nitride, or a combination thereof. In the present embodiment, the gap-fill layer 19 may include silicon nitride. Thus, the lined trench 13 may be filled with the silicon nitride. In another embodiment, the gap-fill layer 19 may include a first dielectric layer 19A and a second dielectric layer 19B. The first dielectric layer 19A completely fills the first trench 13A and partially fills the second trench 13B. The second dielectric layer 19B fills the second trench 13B over the first dielectric layer 19A. The first dielectric layer 19A may include silicon nitride, and the second dielectric layer 19B may include silicon oxide. In another embodiment, the first dielectric layer 108A and the second dielectric layer 108B may include silicon nitride.

The gap-fill layer 19 filled in the first trenches 13A of the lined trench 13 and the gap-fill layer 19 filled in the second trenches 13B of the lined trench 13 may have different thicknesses. The thickness difference of the gap-fill layer 19 may induce a tensile stress and cause leaning and bending of the active regions 14. In the present embodiment, leaning and bending of the active regions 14 may be prevented by the overhangs 18A and the merged portions 18M of the capping layer 18.

Figure 2F:
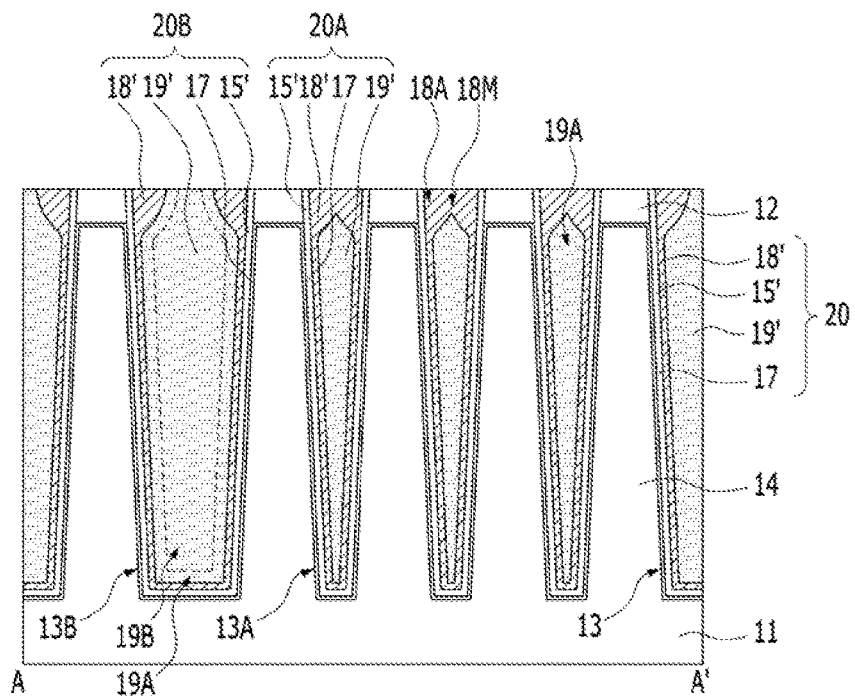

As shown in FIG. 2F, a planarization process may be performed until the top surface of the hard mask layer 12 is exposed. For example, the gap-fill layer 19, the capping layer 18 and the liner layer 15 may be removed from the top of the hard mask layer 12. Accordingly, a gap-fill layer 19', a capping layer 18', the oxide layer 17 and a liner layer 15' may remain in the trench 13. The oxide layer 17 may not be exposed to the planarization process. After the planarization process, the overhangs 18A and the merged portions 18M of the capping layer 18' may remain.

Hereinbelow, the oxide layer 17 will be referred to as a first oxide liner 17, and the liner layer 15' will be referred to as a second oxide liner 15'.

An isolation structure 20 may be formed in the trench 13. The isolation structure 20 may include the first oxide liner 17 that is formed on the bottoms and sidewalls of the trench 13, the second oxide liner 15' formed on the first oxide liner 17, and the gap-fill layer 19' that fills the trench 13 and formed on the second oxide liner 15'. The isolation structure 20 may further include the capping layer 18', and the capping layer 18' may be positioned between the gap-fill layer 19' and the second oxide liner 15'.

In the case in which the gap-fill layer 19' includes an oxide, the isolation structure 20 may become a structure that is fully filled with an oxide-base material. In the case in which the gap-fill layer 19' includes a nitride, the isolation structure 20 may be filled with an oxide-base material and a nitride-base material. The isolation structure 20 may include a plurality of first portions 20A and a plurality of second portions 20B. The first portions 20A of the isolation structure 20 may be filled in the first trenches 13A. The second portion 20B of the isolation structure 20 may be filled in the second trenches 13B. The first portions 20A and the second portions 20B of the isolation structure 20 may be formed of the same material. In the present embodiment, the first trench 13A and the second trenches 13B may be lined with the first oxide liner 17 and the second oxide liner 15', and the first trench 13A and the second trench 13B of the lined trench 13 may be fully filled with the gap-fill layer 19'.

The first portions 20A of the isolation structure 20 may include both of the overhangs 18A and the merged portions 18M. The second portion 20B of the isolation structure 20 may include the overhangs 18A only, but may not include the merged portions 18M. That is, the second portion 20B of the isolation structure 20 may be a merge-free portion. The gap-fill layer 19' formed in the first portions 20A of the isolation structure 20 may be narrower than the gap-fill layer 19' formed in the second portion 20B. The first portions 20A of the isolation structure 20 may be narrower than the second portions 20B.

According to the first embodiment, leaning and bending of the active regions 14 may be prevented by forming the capping layer 18 that has the overhangs 18A and the merged portions 18M.

Figure 3A:
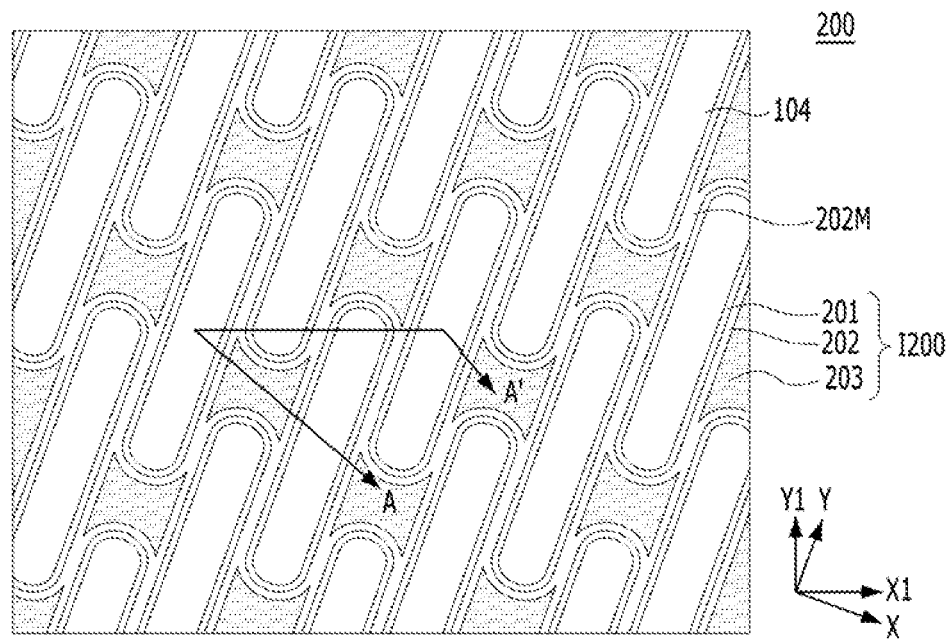
FIGS. 3A and 3B are a plan view and a cross-sectional view of a semiconductor device in accordance with a second embodiment.
Figure 3B:
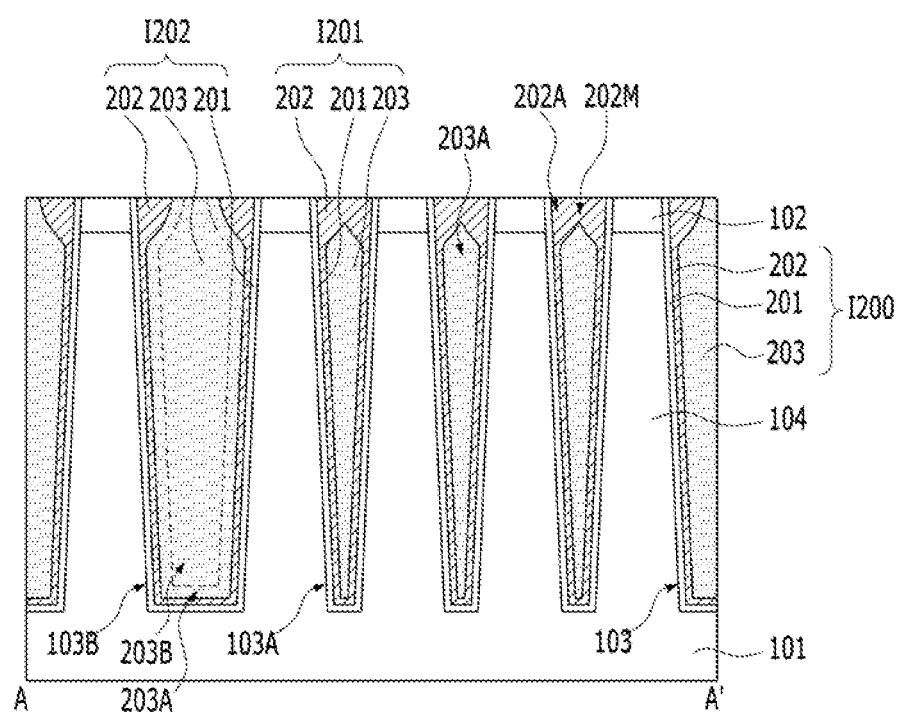

FIGS. 3A and 3B are a plan view and a cross-sectional view of a semiconductor device in accordance with a second embodiment. Some components of a semiconductor device 200 in accordance with a second embodiment may be similar to those of the semiconductor device 100 in accordance with the first embodiment.

Referring to FIGS. 3A and 3B, the semiconductor device 200 may include a plurality of active regions 104 and an isolation structure I200 that defines the plurality of active regions 104. The isolation structure I200 may be formed in trench 103. The active regions 104 and the trench 103 may have the same shapes as shown in FIG. 1A.

The trench 103 may be formed by etching a substrate 101 using a hard mask layer 102. The trench 103 may include a plurality of first trenches 103A and a plurality of second trenches 103B that are wider than the first trenches 103A. The isolation structure I200 may include an oxide liner 201 and a gap-fill layer 203. The isolation structure I200 may include a plurality of first portions I201 and a plurality of second portions I202. The first portions I201 of the isolation structure I200 may be formed in the first trenches 103A. The second portions I202 of the isolation structure I200 may be formed in the second trenches 103B. The first portions I201 and the second portions I202 of the isolation structure I200 may be continuous and connected to each other. The first portions I201 and the second portions I202 of the isolation structure I200 may be formed of the same material. For example, the first trenches 103A and the second trenches 103B may be lined with the oxide liner 201, and the first trenches 103A and the second trenches 103B of the lined trench 103 may be fully filled with the gap-fill layer 203. The oxide liner 201 may include silicon oxide. The isolation structure I200 may be a single oxide liner structure.

The isolation structure I200 may further include a capping layer 202. The capping layer 202 may be formed between the oxide liner 201 and the gap-fill layer 203. The capping layer 202 may conformally cover the bottom and sidewalls of the trench 103 and may be formed on the oxide liner 201.

The capping layer 202 may include overhangs 202A that are positioned at the tops of the sidewalls of the trench 103. Due to the overhangs 202A, the capping layer 202 may have merged portions 202M. Each merged portion 202M may be a portion that is formed as the overhangs 202A of the capping layer 202 contact each other and thereby shields the entrance of the trench 103, in particular, the first trenches 103A. The overhangs 202A may be formed even in the second trenches 103B. The merged portions 202M are not formed in the second trenches 103B. The capping layer 202 may include silicon oxide.

The first portions I201 of the isolation structure I200 may be narrower than the second portion I202. The gap-fill layer 203 formed in the first portions I201 of the isolation structure I200 may be narrower than the gap-fill layer 203 formed in the second portion I202. The gap-fill layer 203 may include silicon oxide, silicon nitride, or a combination thereof. The gap-fill layer 203 may include a first dielectric layer 203A and a second dielectric layer 203B. The first dielectric layer 203A completely fills the first trench 103A and partially fills the second trench 103B. The second dielectric layer 203B fills the second trench 103B over the first dielectric layer 203A. The first dielectric layer 203A may include silicon nitride, and the second dielectric layer 203B may include silicon oxide. In another embodiment, the first dielectric layer 203A and the second dielectric layer 203B may include silicon nitride.

According to the above descriptions, the isolation structure I200 may include the capping layer 202, in particular, the merged portions 202M and the overhangs 202A, and thereby, may prevent bending and leaning of the active regions 104.

FIGS. 4A to 4E illustrate a method for manufacturing the semiconductor device in accordance with the second embodiment. The manufacturing method according to the second embodiment may be similar to the manufacturing method according to the first embodiment except that a liner layer 31 according to the second embodiment may be different from the liner layer 15 of the first embodiment.

Figure 4A:
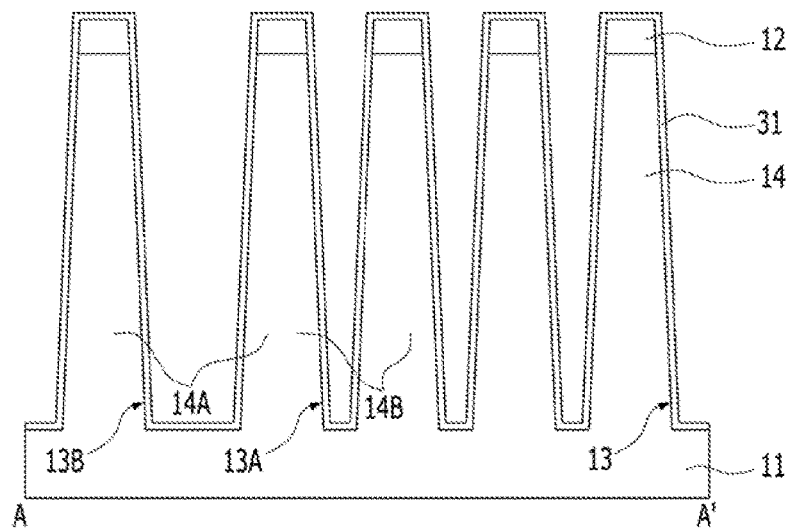
FIGS. 4A to 4E illustrate a method for manufacturing the semiconductor device in accordance with the second embodiment.

As shown in FIG. 4A, the liner layer 31 may be formed. The liner layer 31 may be formed conformally on a substrate 11 that is formed with trench 13. The liner layer 31 may cover the bottoms and sidewalls of the trench 13. Additionally, the liner layer 31 may cover the sidewalls and top surface of a hard mask layer 12. The liner layer 31 may prevent oxidation of the sidewalls of active regions 14 during a subsequent oxidation process. Accordingly, the liner layer 31 may suppress loss of silicon on the sidewalls of the active regions 14.

The liner layer 31 may include a material that is capable of being converted into an oxidized material in a subsequent oxidation process. That is, the liner layer 31 may include a material that is capable of being oxidized during the subsequent oxidation process. The liner layer 31 may include a silicon-containing material. The liner layer 31 may be formed as a silicon layer. The liner layer 31 may be formed as an amorphous silicon layer. The liner layer 31 may be referred to as a liner silicon layer. The liner layer 31 may be deposited by low pressure chemical vapor deposition (LP-CVD).

To improve roughness, the liner layer 31 may be deposited after depositing a seed layer (not shown). The seed layer may be deposited using a diisopropylamino silane (DIPAS) gas. That is, the seed layer may be a silicon layer. The liner layer 31 may be deposited using a disilane ($Si_2H_6$) gas. The liner layer 31 may be deposited at a temperature of 380° C. to 510° C. The liner layer 31 may be deposited to a thickness of 30 Å to 50 Å. In the case in which the liner layer 31 is directly deposited without using a seed layer, roughness may deteriorate and thus uniformity of the subsequent oxidation process may be degraded.

The liner layer 31 according to the present embodiment may have excellent step coverage. The liner layer 31 may be the same thickness at the tops of the trench 13, at the sidewalls of the trench 13, and at the bottom surfaces of the trench 13.

Figure 4B:
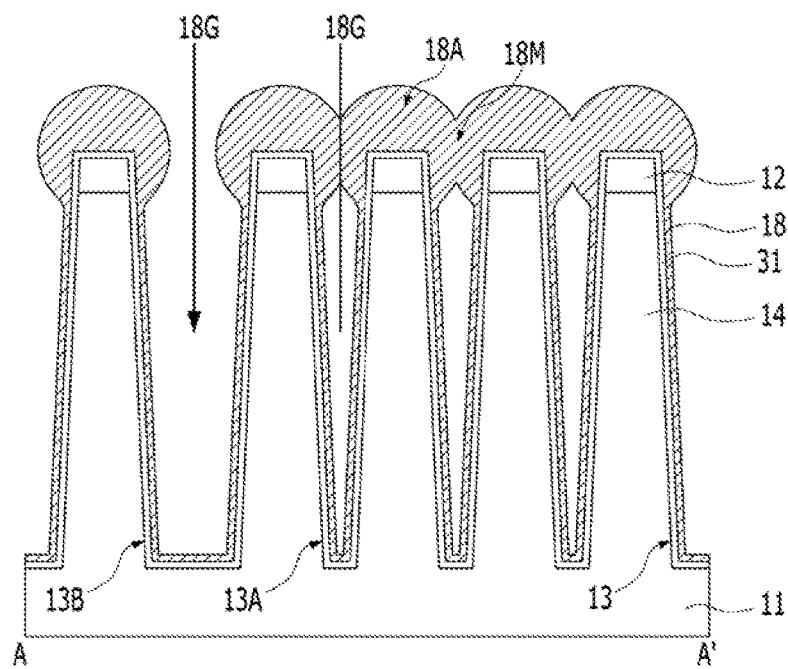

As shown in FIG. 4B, a capping layer 18 may be formed on the liner layer 31. The capping layer 18 may have poor step coverage. That is, thicknesses of the capping layer 18 at the tops of the trench 13, at the sidewalls of the trench 13, and at the bottom surfaces of the trench 13 may be different from one another. Due to such poor step coverage, overhangs 18A may be formed at the tops of the trench 13. Two or more overhangs 18A are combined to form the merged portions 18M. Each merged portion 18M may be a portion that is formed as the overhangs 18A of the capping layer 18 contact each other and thereby shields the entrance of the trench 13, in particular, the first trenches 13A.

A gap 18G may be formed by the merged portions 18M. The overhangs 18A may be formed even in second trenches 13B. The merged portions 18M are not formed in the second trenches 13B. Gaps 18G may extend from the inside of the second trenches 13B to the inside of the first trenches 13A. Since the second trenches 13B are wider than the first trench 13A, only the overhangs 18A are formed in the second trenches 13B, but the merged potion 18M is not formed in the second trenches 13B.

The top portions of the active regions 14 may be protected by the overhangs 18A and the merged portions 18M. Specifically, the sidewalls of the top portions of neighboring active regions 14 may be supported by the overhangs 18A and the merged portions 18M. The overhangs 18A and the merged portions 18M may be used as supports for neighboring active regions 14 during subsequent oxidation and gapfill processes. Due to the gaps 18G, paths for the subsequent oxidation process and gapfill process may be secured.

The capping layer 18 may be formed of oxide. To form the capping layer 18 that has the overhangs 18A and the merged portions 18M, plasma-enhanced chemical vapor deposition (PECVD) may be applied. The capping layer 18 may be formed of a silane ($SiH_4$)-base silicon oxide. In another embodiment, the capping layer 18 may be deposited by atomic layer deposition (ALD). In the case in which atomic layer deposition is applied, in order to induce poor step coverage, the capping layer 18 may be deposited at a low temperature. The capping layer 18 may be deposited to a thickness of 100 Å to 200 Å.

Figure 4C:
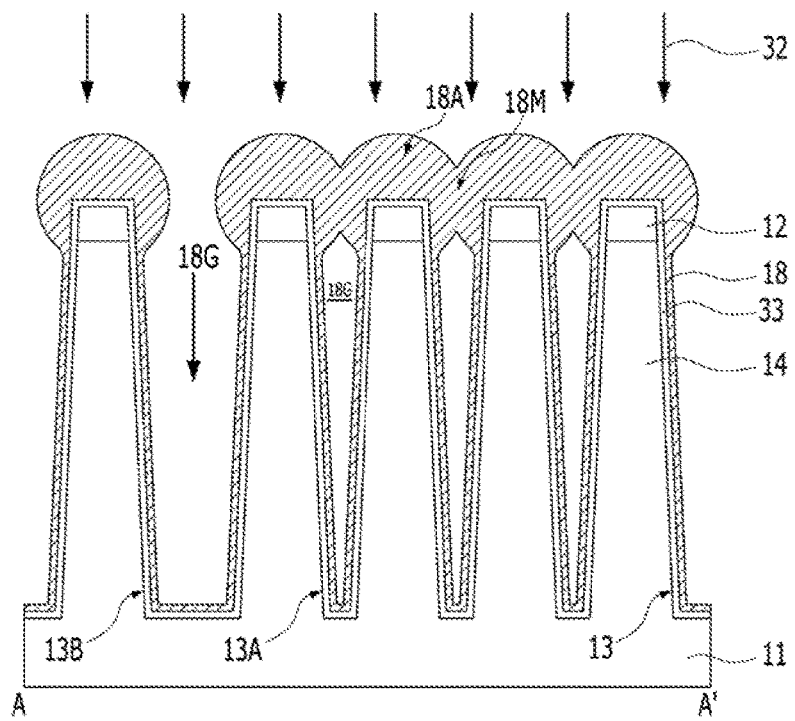

As shown in FIG. 4C, the liner layer 31 may be converted into an oxide liner layer 33. The converting may include an oxidation process 32. The liner layer 31 may be exposed to the oxidation process 32. By the oxidation process 32, etch damage caused in the process of forming the trench 13 may be cured. The liner layer 31 may be oxidized by the oxidation process 32. As a result, the oxide liner layer 33 may be formed. The deposition process of the liner layer 31 and the oxidation process 32 of the liner layer 31 may be performed in situ. During the oxidation process 32 for the liner layer 31, oxidation of the sidewalls of the active regions 14 may be suppressed. That is, oxidation on the sidewalls of the trench 13 may be suppressed. Thus, loss of silicon may be prevented.

Since the liner layer 31 is oxidized by the oxidation process 32, the active regions 14 may retain the same size as before the oxidation process 32. Since loss of silicon on the sidewalls of the trench 13 does not occur, loss of the sidewalls of the active regions 14 does not occur. The oxide liner layer 33 may be formed to a thickness thinner than an oxide liner layer that is formed by performing, a direct oxidation process in the state in which the trench 13 is formed. For example, since it is easy to control a deposition thickness of the liner layer 31, the oxide liner layer 33 may also be formed to a thin thickness. The direct oxidation process refers to a general sidewall thermal oxidation process. In the case in which an oxide liner is formed by the general sidewall thermal oxidation, it is not easy to control thickness therefore loss of the sidewalls of the active regions 14 may occur.

The oxide liner layer 33 may be the same thickness as or thicker than the liner layer 31. To prevent poor gapfill of a gap-fill layer in the trench 13, the thickness of the oxide liner layer 33 may be controlled to or under 60 Å. Since the liner layer 31 is formed in advance, even though the oxide liner layer 33 is formed by the oxidation process 32, the inner spaces of the trench 13 may not be narrowed substantially.

Due to the oxidation process 32, the liner layer 31 may be converted into the oxide liner layer 33. The oxide liner layer 33 may be silicon oxide. The oxide liner layer 33 may be $SiO2$ that is generated when the liner layer 31 is fully oxidized. The oxide liner layer 33 may cover the sidewalls and top surface of the hard mask layer 12.

The oxidation process 32 for forming the oxide liner layer 33 may be performed using a radical oxidation process capable of effectively converting the liner layer 31 into an oxidized material while suppressing loss of the sidewalls of the active regions 14. The radical oxidation process may be performed at a temperature of 750° C. to 900° C. In another embodiment, the oxidation process 32 may be performed using a dry oxidation process under an oxygen atmosphere. The dry oxidation process may be performed at a temperature of 800° C. to 900° C.

During the oxidation process 32 for the liner layer 31 as described above, a leaning phenomenon of the active regions 14 may occur. In the present embodiment, to prevent the leaning phenomenon, the capping layer 18 is formed before the oxidation process 32. The merged portions 18M of the capping layer 18 may serve as supports for preventing leaning of the active regions 14. The trench 13 formed with the oxide liner layer 33 may be referred to as lined trench.

Figure 4D:
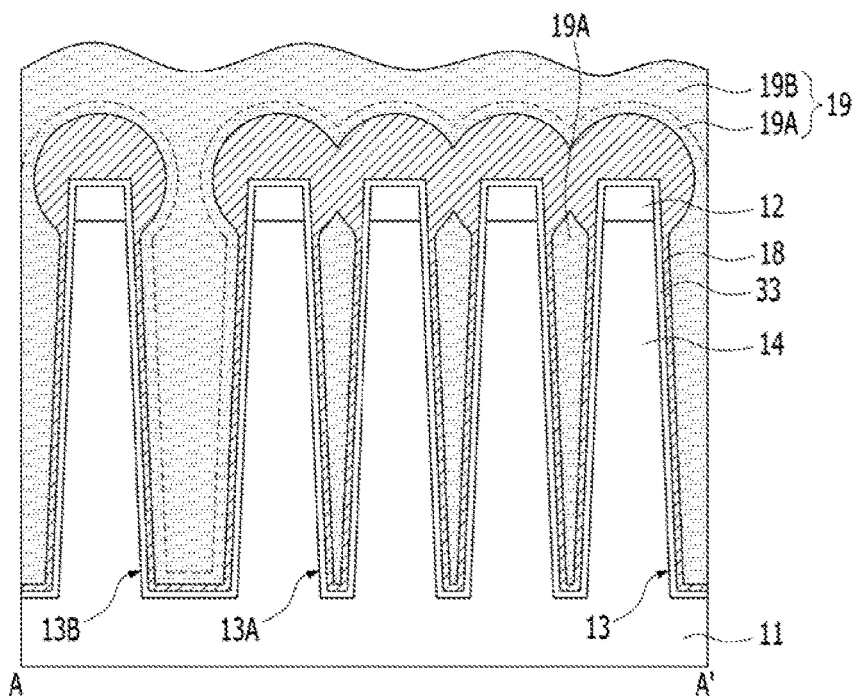

As shown in FIG. 4D, a gapfill process may be performed. For example, a gap-fill layer 19 may be formed on the capping layer 18. The gaps 18G may be filled with the gap-fill layer 19. Accordingly, the gap-fill layer 19 may concurrently fill in the first trenches 13A and the second trenches 13B. The gap-fill layer 19 may include oxide, nitride, or a combination thereof. In the present embodiment, the gap-fill layer 19 may include silicon nitride so that the lined trench 13 may be filled with the silicon nitride. In another embodiment, the gap-fill layer 19 may include a first dielectric layer 19A and a second dielectric layer 19B. The first dielectric layer 19A completely fills the first trench 13A and partially fills the second trench 13B. The second dielectric layer 19B fills the second trench 13B over the first dielectric layer 19A. The first dielectric layer 19A may include silicon nitride, and the second dielectric layer 19B may include silicon oxide. In another embodiment, the first dielectric layer 108A and the second dielectric layer 108B may include silicon nitride.

The gap-fill layer 19 filled in the first trench 13A of the lined trench 13 and the gap-fill layer 19 filled in the second trench 13B of the lined trench 13 may have different thicknesses. The thickness difference of the gap-fill layer 19 may induce a tensile stress so that bending of the active regions 14 may occur. In the present embodiment, bending of the active regions 14 may be prevented by the merged portions 18M of the capping layer 18. The gap-fill layer 19 may be deposited at a temperature of 550° C. to 630° C. to a thickness of 160 Å to 200 Å. To minimize a seam, the gap-fill layer 19 may be deposited by atomic layer deposition (ALD).

Figure 4E:
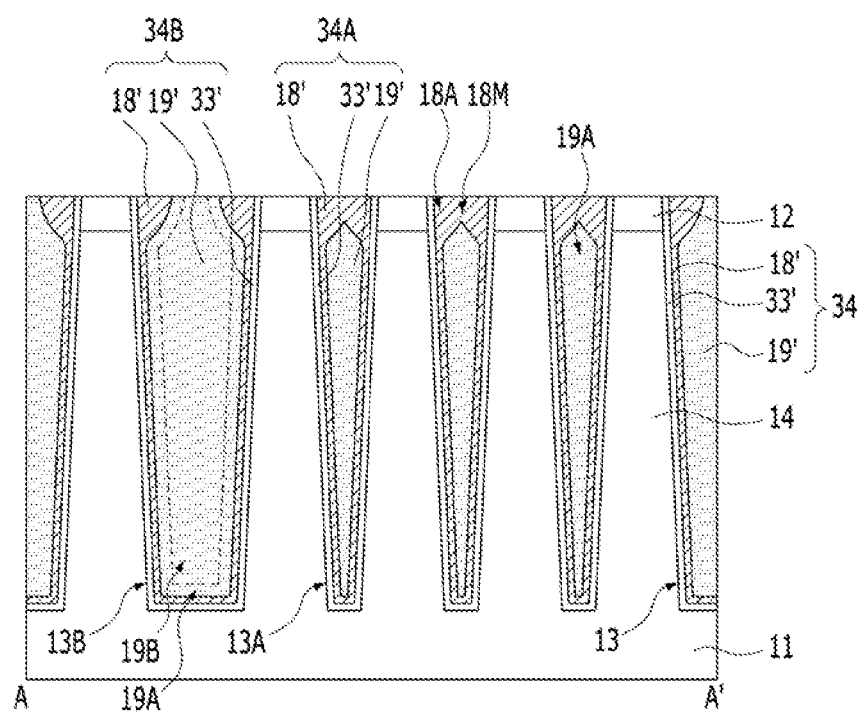

As shown in FIG. 4E, a planarization process may be performed until the top surface of the hard mask layer 12 is exposed. For example, the gap-fill layer 19, the capping layer 18 and the oxide liner layer 33 may be removed from the top of the hard mask layer 12. As a result, a gap-fill layer 19', a capping layer 18' and an oxide liner 33' may remain in the trench 13. After the planarization process, the overhangs 18A and the merged portions 18M of the capping layer 18' may remain in the trench 13.

An isolation structure 34 may be formed in the trench 13. The isolation structure 34 may include (i) the oxide liner 33' that is formed on the bottoms and sidewalls of the trench 13 and (ii) the gap-fill layer 19' that fills the trench 13 and on the oxide liner 33'. The isolation structure 34 may further include the capping layer 18', and the capping layer 18' may be positioned between the gap-fill layer 19 and the oxide liner 33'. In the case in which the gap-fill layer 19' includes oxide, the isolation structure 34 may become a structure that is fully filled with oxide-base material. In the case in which the gap-fill layer 19' includes nitride, the isolation structure 34 may be fully filled with oxide-base material and nitride-base material.

The isolation structure 34 may include a plurality of first portions 34A and a plurality of second portions 34B. The first portions 34A of the isolation structure 34 may fill in the first trenches 13A. The second portion 34B of the isolation structure 34 may fill in the second trenches 13B. The first portions 34A and the second portion 34B of the isolation structure 34 may be formed of the same material.

In the present embodiment, the first trench 13A and the second trenches 13B may be lined with the oxide liner 33', and the first trench 13A and the second trench 13B of the lined trench 13 may be fully filled with the gap-fill layer 19'. The first portion 34A of the isolation structure 34 may include the merged portions 18M, and the second portion 34B of the isolation structure 34 may not include the merged portions 18M. That is, the second portion 34B of the isolation structure 34 may be a merge-free portion. The first portions 34A of the isolation structure 34 may be narrower than the second portion 34B. The gap-fill layer 19' formed in the first portions 34A of the isolation structure 34 may be narrower than the gap-fill layer 19 formed in the second portion 34B.

According to the second embodiment, leaning of the active regions 14 during the oxidation process 32 may be prevented by forming the capping layer 18 that has the overhangs 18A and the merged portions 18M. Furthermore, bending of the active regions 14 may be prevented by the overhangs 18A and the merged portions 18M of the capping layer 18.

Figure 5A:
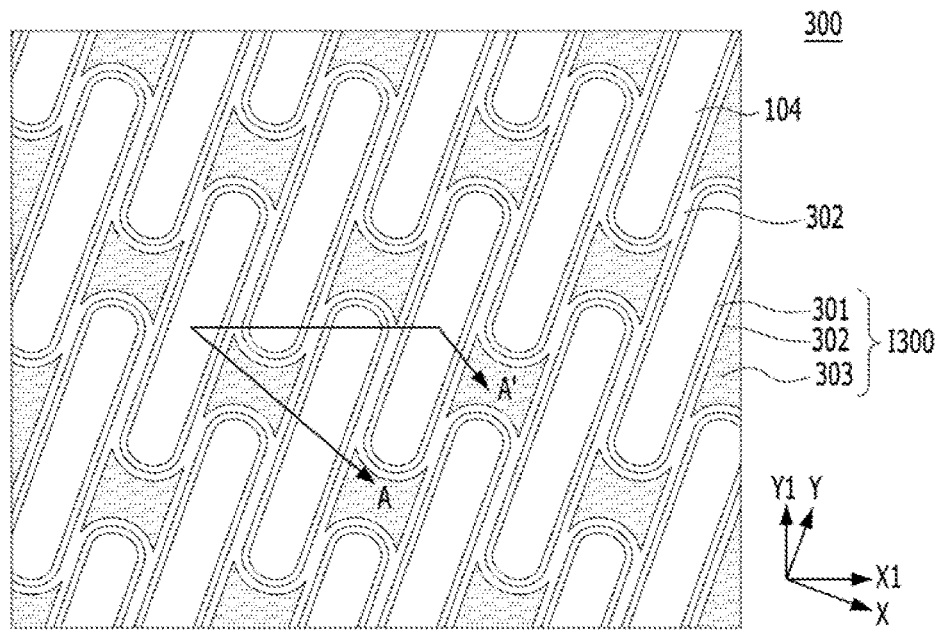
FIGS. 5A and 5B are a plan view and a cross-sectional view of a semiconductor device in accordance with a third embodiment.
Figure 5B:
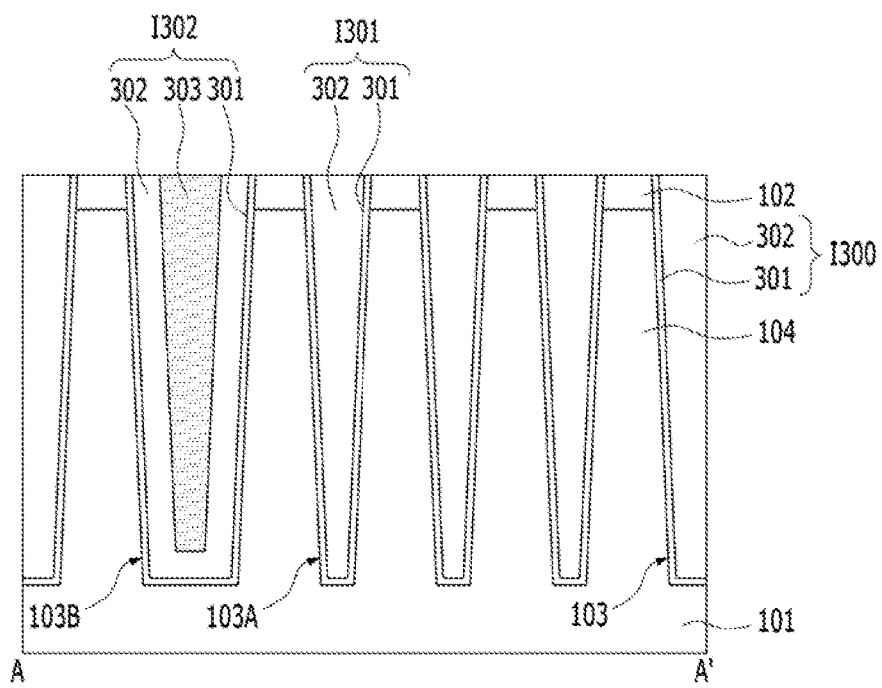

FIGS. 5A and 5B area plan view and a cross-sectional view illustrating a semiconductor device in accordance with a third embodiment. Some components of a semiconductor device 300 in accordance with a third embodiment may be similar to those of the semiconductor device 100 in accordance with the first embodiment.

Referring to FIGS. 5A and 5B, the semiconductor device 300 may include a plurality of active regions 104 and an isolation structure I300 that defines the plurality of active regions 104. The isolation structure I300 may be formed in trench 103. The active regions 104 and the trench 103 may have the same shapes as those shown in FIG. 1A.

The trench 103 may be formed by etching a substrate 101 using a hard mask layer 102. The trench 103 may include a plurality of first trenches 103A and a plurality of second trenches 103B that are wider than the first trenches 103A. The isolation structure I300 may include an oxide liner 301 and a gap-fill layer. The isolation structure I300 may include a plurality of first portions I301 and a plurality of second portions I302. The first portions I301 of the isolation structure I300 may be formed in the first trenches 103A. The second portions I302 of the isolation structure I300 may be formed in the second trenches 103B. The first portions I301 and the second portions I302 of the isolation structure I300 may be continuous.

The first portions I301 and the second portions I302 of the isolation structure I300 may be formed of different materials. For example, the first trenches 103A may be lined with the oxide liner 301, and the first trenches 103A of the lined trench 103 may be fully filled with a gapfill oxide layer 302. The oxide liner 301 may include silicon oxide. The second trenches 103B may be lined with the oxide liner 301 and the gapfill oxide layer 302, and the second trenches 103B of the lined trench 103 may be fully filled with a gapfill nitride layer 303. The oxide liner 301 and the gapfill oxide layer 302 may include silicon oxide. The gapfill nitride layer 303 may include silicon nitride.

The first portions I301 of the isolation structure I300 may be narrower than the second portions I302. The first portions I301 and the second portions I302 of the isolation structure I300 may have different gapfill materials. For example, the first portions I301 may be filled with the gapfill oxide layer 302 and the second portions I302 may be filled with the gapfill nitride layer 303.

According to the above descriptions, the isolation structure I300 may include the gapfill oxide layer 302, and thereby, may prevent bending and leaning of the active regions 104.

FIGS. 6A to 6E illustrate a method for manufacturing the semiconductor device in accordance with the third embodiment. The manufacturing method according to the third embodiment may be similar to the manufacturing method according to the second embodiment. A liner layer 31 according to the third embodiment may be formed of the same material as the liner layer 31 of the second embodiment, and may be formed by the same method.

Figure 6A:
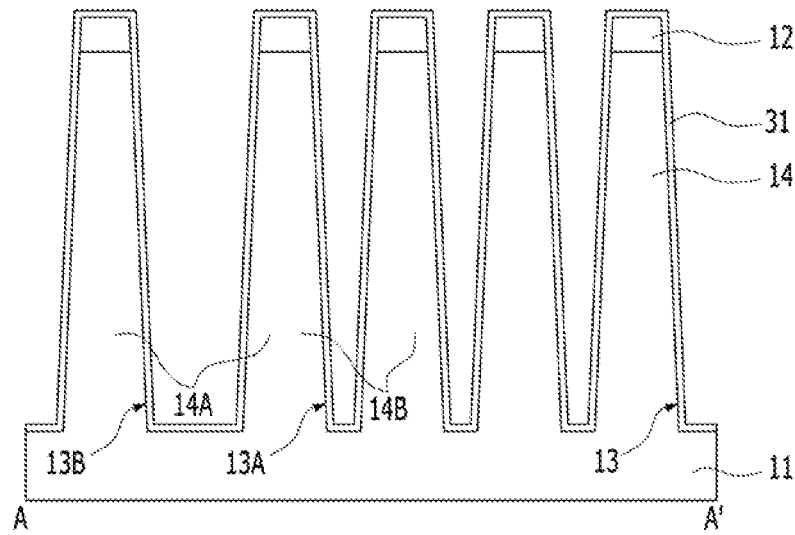
FIGS. 6A to 6E illustrate a method for manufacturing the semiconductor device in accordance with the third embodiment.

As shown in FIG. 6A, the liner layer 31 may be formed. The liner layer 31 may be formed conformally on a substrate 11 with trench 13. The liner layer 31 may cover the bottoms and sidewalls of the trench 13. Also, the liner layer 31 may cover the sidewalls and top surface of a hard mask layer 12.

Figure 6B:
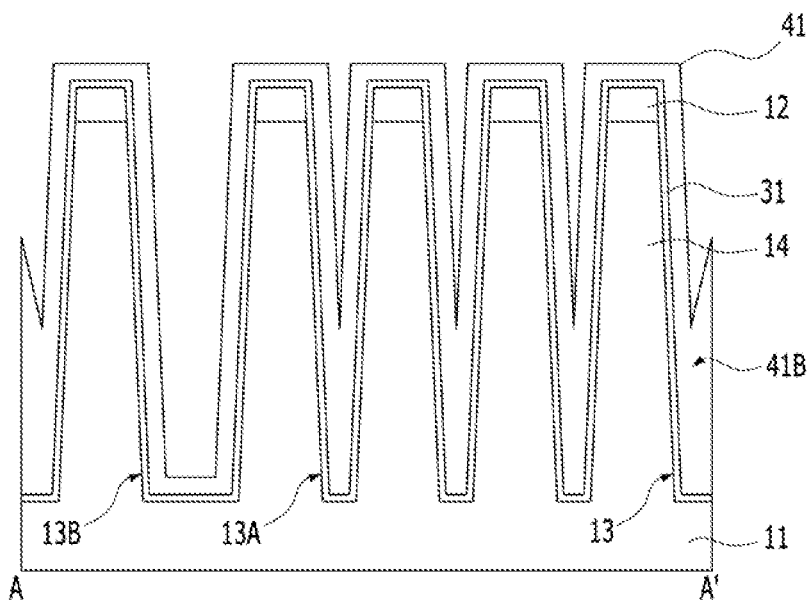

As shown in FIG. 6B, an additional liner layer 41 may be formed on the liner layer 31. The additional liner layer 41 may be a material that is different from the liner layer 31. The additional liner layer 41 may be oxide-base material. The additional liner layer 41 may be flowable oxide. The additional liner layer 41 may be formed of silicon oxide. The additional liner layer 41 may be hydrogen-containing silicon oxide. For example, the additional liner layer 41 may be HQ (hydrogen quioxane) SiO.

The first trench 13A may be partially filled by the additional liner layer 41. That is, the additional liner layer 41 may be formed from the bottoms of the first trench 13A to have bottom-up shapes 41B. Upper portions of the first trench 13A may not be filled.

The additional liner layer 41 may be formed conformally on second trench 13B. The additional liner layer 41 may be formed by Spin on Coating. Since the additional liner layer 41 is flowable oxide, it is possible to compensate for a stress which may occur by a volume expansion during a subsequent oxidation process.

Figure 6C:
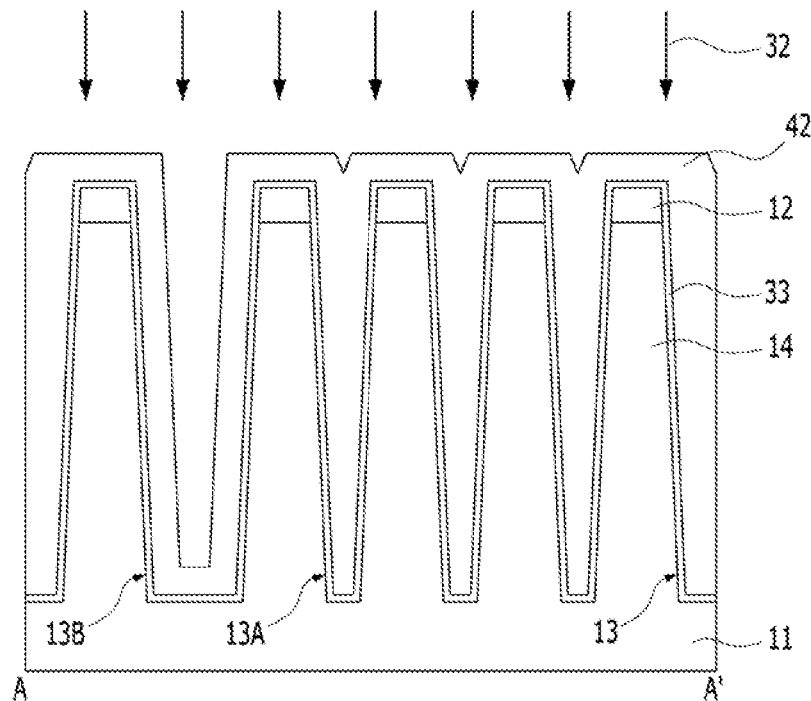

As shown in FIG. 6C, the additional liner layer 41 and the liner layer 31 may be exposed to an oxidation process 32. By the oxidation process 32, etch damage caused in the process of forming the trench 13 may be cured. By the oxidation process 32, the liner layer 31 may be oxidized and the additional liner layer 41 may be densified. The liner layer 31 may be converted into an oxide liner 33, and a volume expansion may occur when the liner layer 31 is converted into the oxide liner 33. As the additional liner layer 41 is densified, the additional liner layer 41 may fully fill the first trench 13A. The additional liner layer 41 after the oxidation process 32 will be referred to as a gapfill oxide layer 42. The gapfill oxide layer 42 may fill the first trench 13A, and may line the second trench 13B.

Since the liner layer 31 is oxidized by the oxidation process 32, oxidation of the sidewalls of the active regions 14 may be suppressed. Accordingly, the active regions 14 may remain with the same size as before the oxidation process 32. Since a loss of silicon on the sidewalls of the trench 13 does not occur, a loss of the sidewalls of the active regions 14 does not occur.

The gapfill oxide layer 42 may be silicon oxide. The gapfill oxide layer 42 may cover the sidewalls and the top surface of the hard mask layer 12.

The oxidation process 32 may be performed using a radical oxidation process. In another embodiment, the oxidation process 32 may be performed using a dry oxidation process under an oxygen atmosphere. The radical oxidation process may be performed at a temperature of 750° C. to 900° C. The dry oxidation process may be performed at a temperature of 800° C. to 900° C.

During the oxidation process 32 as described above, a leaning phenomenon of the active regions 14 may be suppressed. That is, since the first trench 13A is fully filled with the gapfill oxide layer 42, leaning of the active regions 14 is prevented. In the present embodiment, the first trench 13A is fully filled with oxide-base material. This may be referred to as an oxide-gapfilled structure.

Figure 6D:
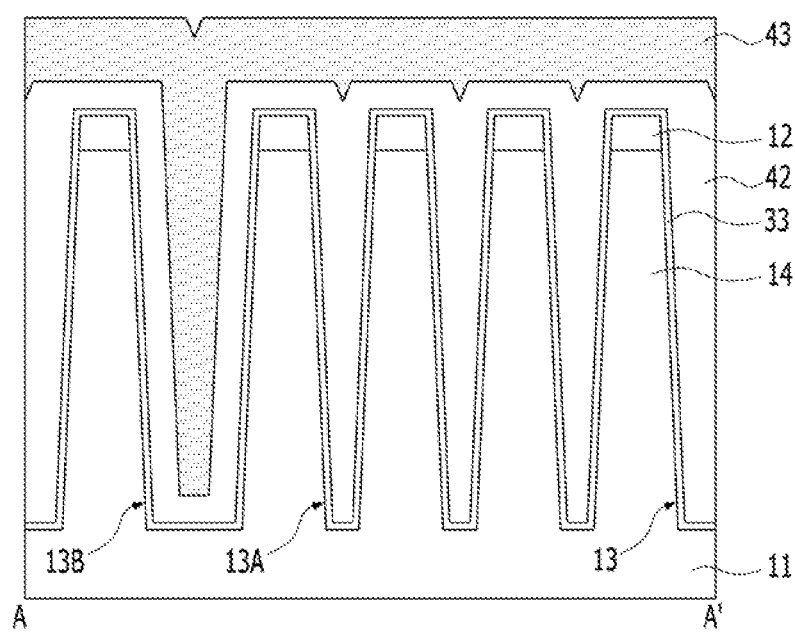

As shown in FIG. 6D, a gapfill process may be performed. For example, a gapfill nitride layer 43 may be formed on the gapfill oxide layer 42. The gapfill nitride layer 43 may fill in the second trench 13B. The gapfill nitride layer 43 may include silicon nitride. As a result, the second trench 13B of the lined trench 13 may be filled with silicon nitride. The gapfill oxide layer 42 filled in the first trench 13A of the lined trench 13 and the gapfill nitride layer 43 filled in the second trench 13B of the lined trench 13 may have different thicknesses. Since the gapfill nitride layer 43 is formed after the gapfill oxide layer 42 is formed, bending of the active regions 14 may be prevented.

Figure 6E:
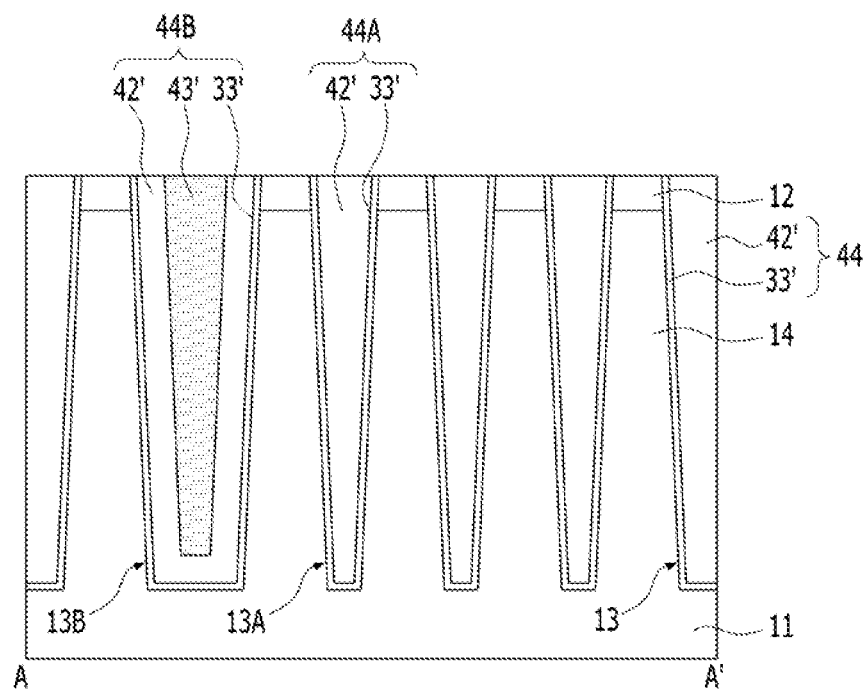

As shown in FIG. 6E, a planarization process may be performed until the top surface of the hard mask layer 12 is exposed. For example, the gapfill nitride layer 43, the gapfill oxide layer 42 and the oxide liner 33 may be removed from the top of the hard mask layer 12. As a result, a gapfill oxide layer 42' and an oxide liner 33' may remain in the first trench 13A. A gapfill nitride layer 43', the gapfill oxide layer 42' and the oxide liner 33' may remain in the second trench 13B.

An isolation structure 44 may be formed in the trench 13. The isolation structure 44 may include a plurality of first portions 44A and a plurality of second portions 44B. The first portions 44A of the isolation structure 44 may fill in the first trenches 13A. The second portions 44B of the isolation structure 44 may fill in the second trenches 13B. The first portions 44A and the second portions 44B of the isolation structure 44 may be formed of different materials from each other. In the present embodiment, the first trench 13A may be lined with the oxide liner 33' and may be fully filled with the gapfill oxide layer 42'. The second trench 13B may be lined with a stack of the oxide liner 33' and the gapfill oxide layer 42', and may be fully filled with the gapfill nitride layer 43'. The gapfill oxide layer 42' may be thinner than the gapfill nitride layer 43'. The first trench 13A and the second trench 13B may be lined with an oxide-base material. The first trench 13A of the lined trench 13 is filled with the oxide-base material, and the second trench 13B of the lined trench 13 is filled with a nitride-base material.

According to the third embodiment, by forming the oxide liner 33 and the gapfill oxide layer 42 by the oxidation process 32, leaning and bending of the active regions 14 may be prevented.

FIGS. 7A to 7G illustrate a method for manufacturing a memory cell, as an application example of the present embodiments. First, as shown in FIGS. 4A to 4E, an isolation structure 34 and active regions 14 may be formed. The isolation structure 34 may be formed in the same way as the second embodiment.

Figure 7A:
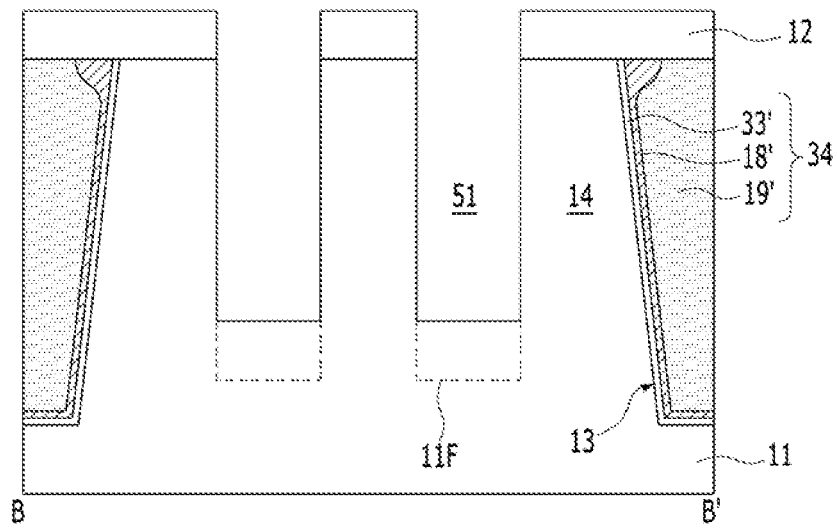
FIGS. 7A to 7G illustrate a method for manufacturing a memory cell according to embodiments.

Next, as shown in FIG. 7A, the hard mask layer 12 may be patterned. Accordingly, the hard mask layer 12 may be patterned to include a plurality of line-shaped openings (not shown). The plurality of openings may define regions where gate electrodes will be disposed. The openings of the hard mask layer 12 may be formed to expose portions of the active regions 14 and portions of the isolation structure 34.

To form one or more gate trench 51, the substrate 11 exposed by the openings of the hard mask layer 12 may be etched. That is, to form the gate trench 51, the exposed portions of the active regions 14 and the exposed portions of the isolation structure 34 may be etched. The bottom surfaces of the gate trench 51 may be located at a level lower than the top surface of the active region 14. The gate trench 51 may have a line shape. The gate trench 51 may extend across the active region 14 and the isolation structure 34. When gate electrodes or buried word lines are formed in the gate trench 51, an effective channel length may be increased and a short channel effect may be lessened.

The gate trench 51 may extend in any one direction. For example, the gate trench 51 may extend in the third direction X1 of FIG. 1A. The gate trench 51 may extend across the active region 14 and the isolation structure 34. Subsequently, a fin region 11F may be formed. In order to form the fin region 11F, the isolation structure 34 under the gate trench 51 may be recessed.

Figure 7B:
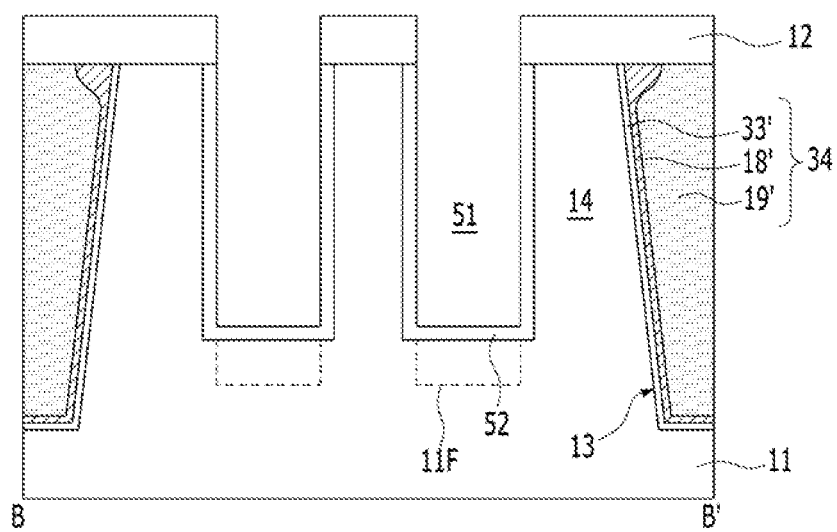

As shown in FIG. 7B, a gate dielectric layer 52 may be formed. The gate dielectric layer 52 may be formed by a thermal oxidation process. Besides the thermal oxidation process, the gate dielectric layer 52 may be formed by the following various methods. For example an oxidation process may be performed after forming an oxide liner to form the gate dielectric layer 52. That is, after depositing a high temperature oxide, the high temperature oxide may be exposed to a radical oxidation process.

For another example, an oxidation process may be performed after forming a liner polysilicon layer. That is, after depositing a liner polysilicon layer, the liner polysilicon layer may be exposed to a radical oxidation process. As a result, the liner polysilicon layer may be fully oxidized and may be converted into the gate dielectric layer 52. The liner polysilicon layer may be formed using a seed layer.

For still another example, an oxidation process may be performed after forming a nitride liner. That is, the gate dielectric layer 52 may be formed by fully oxidizing the nitride liner by a radical oxidation process.

When the gate dielectric layer 52 is formed using an oxide liner, a liner polysilicon layer or a nitride liner as described above, a loss of the sidewalls of the active regions 14 may be minimized or prevented. As a result, during a process for forming the isolation structure 34 and a process for forming the gate dielectric layer 52, the active regions 14 may be stably formed without leaning and bending.

Figure 7C:
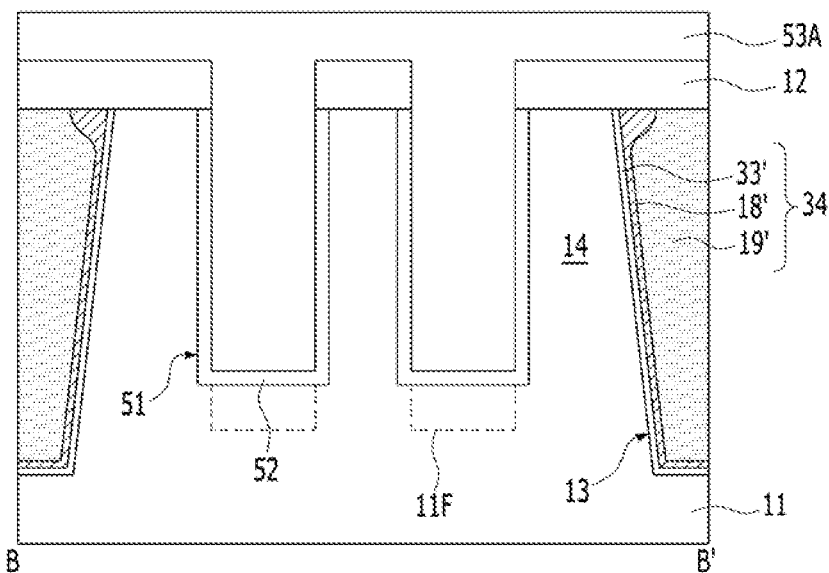

As shown in FIG. 7C, a gate layer 53A may be formed on the gate dielectric layer 52. The gate layer 53A may be formed to fill the gate trench 51 and on the gate dielectric layer 52. The gate layer 53A may be formed on the entire surface of a substrate 11 including the gate dielectric layer 52. To reduce resistivity of gate electrodes, the gate layer 53A may include a low resistivity metal. For example, the gate layer 53A may include tungsten (W), a titanium nitride (TiN) or a combination thereof.

Figure 7D:
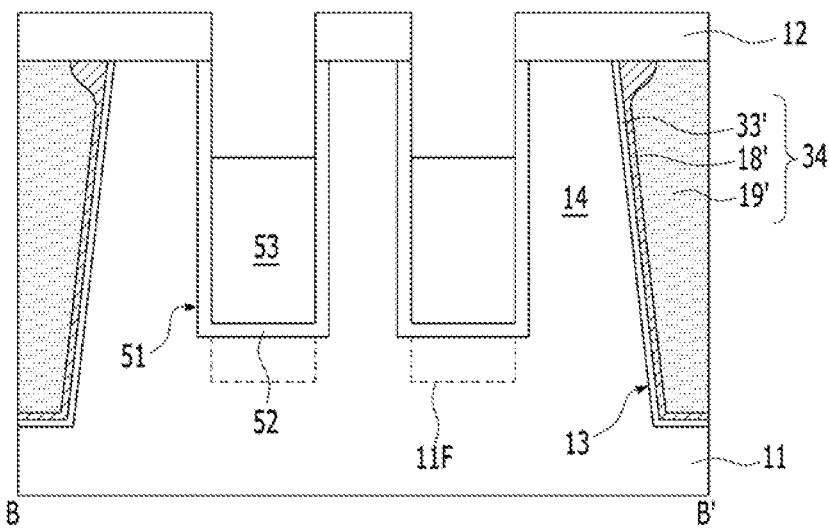

As shown in FIG. 7D, gate electrodes 53 may be formed. To form the gate electrodes 53, the gate layer 53A may be recessed. The top surfaces of the gate electrodes 53 may be located at a level lower than the top surface of the substrate 11. Recessing of the gate layer 53A may be performed by a planarization process and an etch-back process. The gate electrodes 53 may be referred to as buried word lines. The gate electrodes 53 may include a high work function material to reduce a channel dose.

Figure 7E:
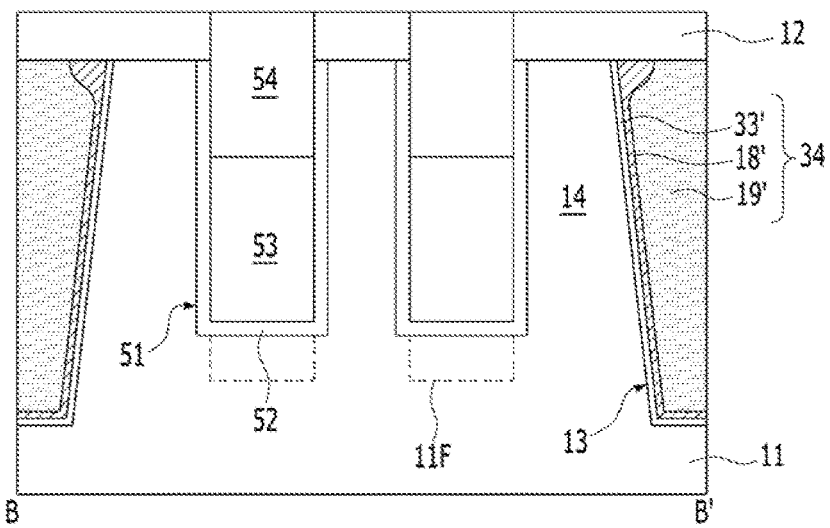

As shown in FIG. 7E, a gate capping layer 54 may be formed on the gate electrodes 53. To form the gate capping layer 54, a capping material (not shown) may be filled in the gate trench 51 and on the gate electrodes 53. Subsequently, the capping material may be planarized by CMP or an etch-back process. The planarized capping material may become the gate capping layer 54.

Figure 7F:
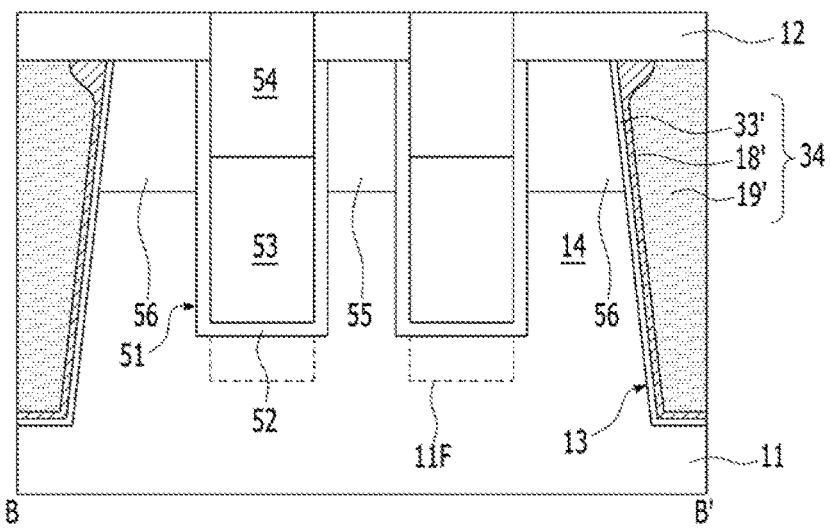

As shown in FIG. 7F, doping regions 55 and 56 may be formed. The doping regions 55 and 56 may be formed by a doping process such as implantation. Each of the doping regions 55 and 56 may include an N-type dopant or a P-type dopant. The doping region 55 may be referred to as a bit line contact node 55. The other doping region 56 may be referred to as a storage node contact node 56.

Figure 7G:
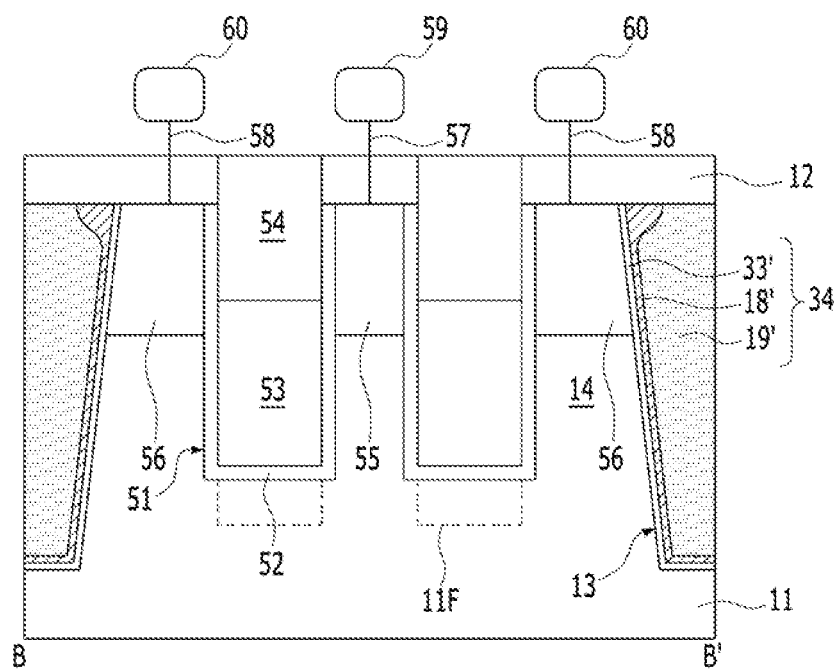

As shown in FIG. 7G, a bit line contact plug 57 that is coupled to the bit line contact node 55 may be formed. Subsequently, a bit line 59 that is coupled to the bit line contact plug 57 may be formed.

A storage node contact plug 58 that is coupled to the storage node contact node 56 may be formed. The storage node contact plug 58 may be coupled to the doping region 56. Subsequently, a memory element 60 that is coupled to the storage node contact plug 58 may be formed. The memory element 60 may include a capacitor.

Figure 8:
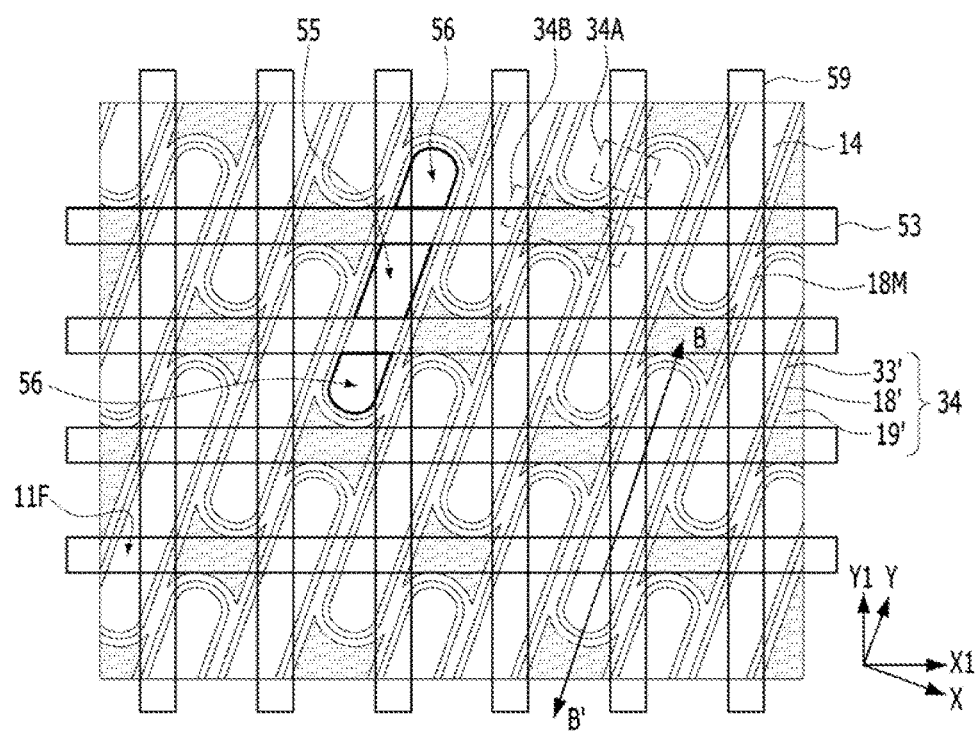
FIG. 8 is a plan view of a memory cell array according to FIG. 7G.

FIG. 8 is a plan view illustrating a memory cell array. FIGS. 7A to 7G may be cross-sectional views along the line B-B' of FIG. 8.

Referring to FIG. 8, a plurality of gate electrodes 53 may be formed to extend in the third direction X1, and a plurality of bit lines 59 may be formed to extend in the fourth direction Y1. Each active region 14 may include a bit line contact node 55 and storage node contact nodes 56. The bit line contact node 55 may be formed in a center portion of the active region 14. The storage node contact nodes 56 may be formed in end portions, respectively, of the active region 14.

Among a plurality of storage node contact nodes 56, storage node contact nodes 56 that neighbor in the first direction X may be separated by first portions 34A of the isolation structure 34. Among a plurality of bit line contact nodes 55, bit line contact nodes 55 that neighbor in the first direction X may be separated by second portions 34B of the isolation structure 34. Accordingly, a distance between two neighboring storage node contact nodes 56 may be narrower than a distance between two neighboring bit line contact nodes 55. The first portions 34A and the second portions 34B of the isolation structure 34 may include an oxide liner 33', a capping layer 18' and a gap-fill layer 19'.

Figure 9:
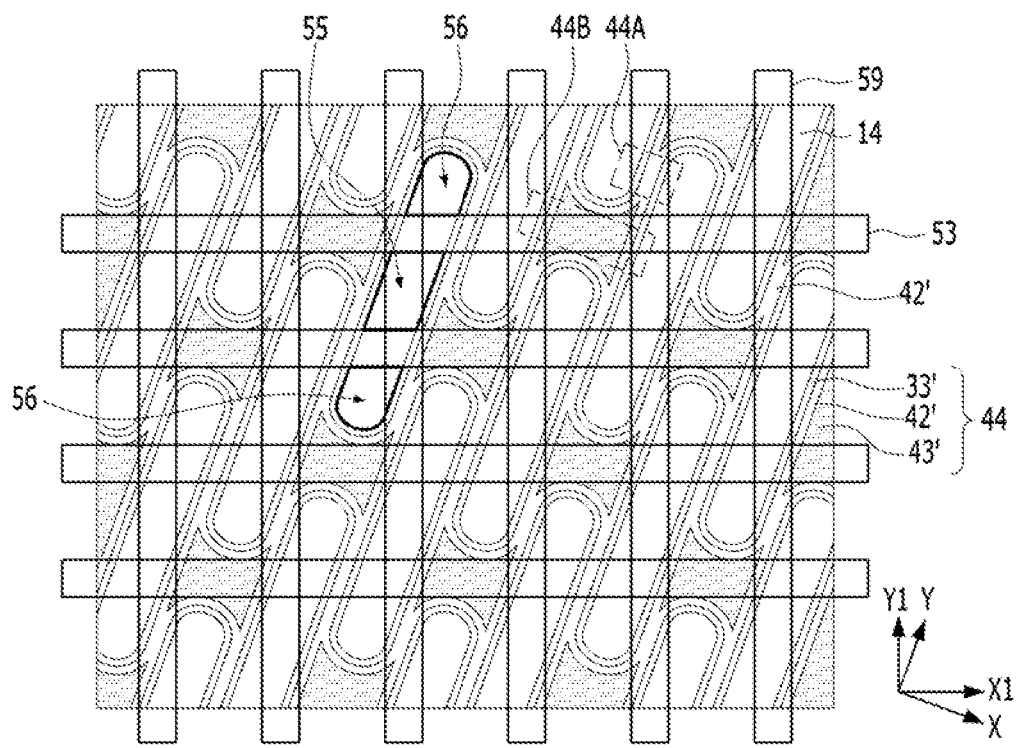
FIG. 9 is a memory cell array to which the third embodiment is applied.

FIG. 9 is a view of a memory cell array to which the third embodiment is applied. The memory cell array according to FIG. 9 may be formed by the manufacturing method shown in FIGS. 7A to 7G. However, an isolation structure may be formed by the manufacturing method shown in FIGS. 6A to 6E.

Referring to FIG. 9, among a plurality of storage node contact nodes 56, storage node contact nodes 56 that neighbor in the first direction X may be separated by first portions 44A of the isolation structure 44. Among a plurality of bit line contact nodes 55, bit line contact nodes 55 that neighbor in the first direction X may be separated by second portions 44B of the isolation structure 44. Accordingly, a distance between two neighboring storage node contact nodes 56 may be narrower than a distance between two neighboring bit line contact nodes 55.

The first portions 44A of the isolation structure 44 may include an oxide liner 33' and a gapfill oxide layer 42'. The second portions 44B of the isolation structure 44 may include the oxide liner 33', the gapfill oxide layer 42' and a gapfill nitride layer 43'. Accordingly, a gap or space between two neighboring storage node contact nodes 56 may be filled with oxide, and a gap or space between two neighboring bit line contact nodes 55 may be filled with oxide and nitride.

Figure 10:
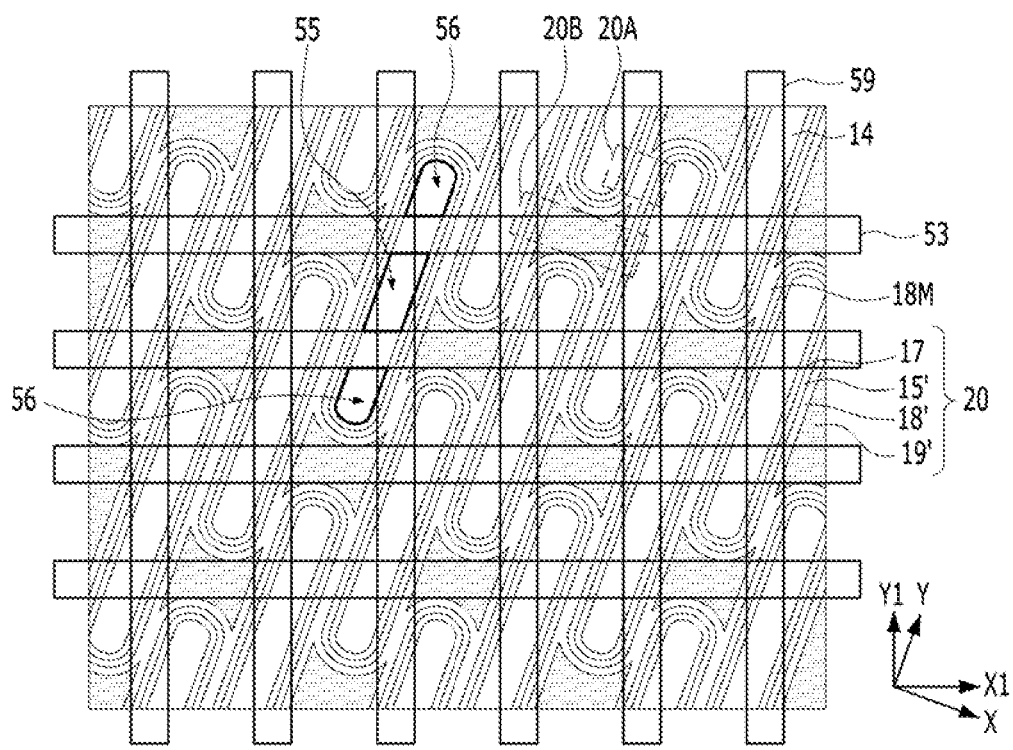
FIG. 10 is a memory cell array to which the first embodiment is applied.

FIG. 10 is a view of a memory cell array to which the first embodiment is applied. The memory cell array according to FIG. 10 may be formed by the manufacturing method shown in FIGS. 7A to 7G. However, an isolation structure may be formed by the manufacturing method shown in FIGS. 2A to 2F.

Referring to FIG. 10, among a plurality of storage node contact nodes 56, storage node contact nodes 56 that neighbor in the first direction X may be separated by first portions 20A of the isolation structure 20. Among a plurality of bit line contact nodes 55, bit line contact nodes 55 that neighbor in the first direction X may be separated by second portions 20B of the isolation structure 20. Accordingly, a distance between two neighboring storage node contact nodes 56 may be narrower than a distance between two neighboring bit line contact nodes 55. The first portions 20A and the second portions 20B of the isolation structure 20 may include an oxide layer 17, a liner layer 15', a capping layer 18' and a gap-fill layer 19'.

The semiconductor devices according to the above-described embodiments may be applied to a dynamic random access memory (DRAM), but not limited thereto. For example, the semiconductor devices according to the above-described embodiments may also be applied to a memory such as a static random access memory (SRAM), a flash memory, a ferroelectric random access memory (FeRAM), a magnetic random access memory (MRAM) and a phase change random access memory (PRAM).

According to the embodiments, since a capping layer is formed as a supporter, it is possible to prevent leaning and bending of an active region. Additionally, according to the embodiments, since a silicon liner layer is used, a critical dimension or a size of the active region may be sufficiently secured. Furthermore, in the embodiments, since the capping layer is formed, it is possible to stably fill a trench without leaning of the active region.

Moreover, according to the embodiments, since an oxidant path for a top portion of the active region may be lengthened in the process of oxidizing the silicon liner layer by forming the capping layer, whereby it is possible to secure a critical dimension of the top portion of the active region. In addition, according to the embodiments, a bending phenomenon of the active region which may be caused in the process of gap-filling a nitride may be prevented by supporting the top portion of the active region by using a capping oxide.

Although various embodiments have been described for illustrative purposes, it will be apparent to those skilled in the art that various changes and modifications may be made without departing from the spirit and scope of the invention as defined in the following claims.

What is claimed is:

1. A method for manufacturing a semiconductor device, comprising:
    forming a first trench and a second trench in a substrate, wherein the first and the second trenches are electrically connected, wherein the second trench is formed wider than the first trench;
    forming a liner layer over an inner surface of the first trench and over an inner surface of the second the trench;
    forming a capping layer over the liner layer to form a merged overhang and a non-merged overhang, wherein the merged overhang fills a top portion of the first trench, wherein the non-merged overhang opens a top portion of the second trench; and
    forming a gap-fill layer over the capping layer to fill a lower portion of the first trench and the second trench.

2. The method according to claim 1,
    wherein the merged overhang defines a first gap in the lower portion of the first trench,
    wherein the non-merged overhang defines a second gap in the second trench,
    wherein the first and the second gaps are electrically connected, and
    wherein the gap-fill layer fills the first and the second gaps and extends from the second gap to the first gap.

3. The method according to claim 1, further comprising:
    planarizing the gap-fill layer and the capping layer to form an isolation structure in the first and the second trenches,
    wherein the planarized gap-fill layer includes a first planarized gap-fill layer disposed in the first trench and a second planarized gap-fill layer disposed in the second trench,
    wherein the first planarized gap-fill layer is completely covered by the merged overhang, and
    wherein the second planarized gap-fill layer is formed over a top sidewall of the first trench.

4. The method according to claim 1,
    wherein the capping layer is formed by plasma-enhanced chemical vapor deposition (PECVD) or low temperature atomic layer deposition (ALD).

5. The method according to claim 1,
    wherein the capping layer includes an oxide-base material.

6. The method according to claim 1, wherein the forming of the liner layer comprises:
    forming a seed silicon layer over the inner surface of the first trench and over the inner surface of the second trench; and
    forming an amorphous silicon layer over the seed silicon layer.

7. The method according to claim 6, further comprising:
    after the forming of the capping layer, converting the liner layer into a silicon oxide layer.

8. The method according to claim 7,
    wherein the converting of the liner layer into the silicon oxide layer is performed by radical oxidation or dry oxidation.

9. The method according to claim 1, wherein the forming of the liner layer comprises:
    forming a first oxide layer over the inner surface of the first trench and over the inner surface of the second trench; and
    performing an oxidation process to form a second oxide layer between the inner surfaces of the first and the second trenches and the first oxide layer.

10. The method according to claim 9,
    wherein the oxidation process is performed by radical oxidation or dry oxidation.

11. The method according to claim 1, wherein the forming of the gap-fill layer comprises:
    forming a first dielectric layer over the capping layer, wherein the first dielectric layer substantially completely fills the first trench and partially fills the second trench; and
    forming a second dielectric layer over the first dielectric layer to fill the second trench.

12. The method according to claim 11,
    wherein the first dielectric layer includes nitride, and
    wherein the second dielectric layer includes oxide.

13. The method according to claim 11,
    wherein each of the first dielectric layer and the second dielectric layer includes nitride.

14. The method according to claim 1, further comprising:
    planarizing the gap-fill layer and the capping layer to form an isolation structure in the first and the second trenches, wherein the isolation structure defining active regions;
    forming a gate trench that extends across the isolation structure and the active regions;
    forming a gate dielectric layer over an inner surface of the gate trench;
    forming a gate layer over the gate dielectric layer to fill the gate trench;
    recessing the gate layer to form a gate electrode so that the gate electrode remains in the gate trench; and
    forming a gate capping layer over the gate electrode and in the gate trench.

15. The method according to claim 14, further comprising:
    recessing the isolation structure under the gate trench to form a fin region.

16. The method according to claim 14, wherein the forming of the gate dielectric layer comprises:
    forming a silicon layer over the inner surface of the gate trench; and
    converting the silicon layer into a silicon oxide layer.

17. The method according to claim 14, wherein the forming of the gate dielectric layer comprises:
    forming a silicon nitride layer over the inner surface of the gate trench; and
    converting the silicon nitride layer into the silicon oxide layer.

18. The method according to claim 14, wherein the forming of the gate dielectric layer comprises:
- forming a first silicon oxide layer over the inner surface of the gate trench; and
- performing an oxidation process to form a second silicon oxide layer between the inner surface of the gate trench and the first silicon oxide layer.

19. The method according to claim 14, further comprising:
- forming a first contact node and a second contact node in each of the active regions;
- forming a bit line coupled to the first contact node; and
- forming a memory element coupled to the second contact node.

20. The method according to claim 1,
- wherein the first and the second trenches define active regions,
- wherein the active regions comprise:
  - a first pair of active regions defined by the first trench and is supported by the merged overhang; and
  - a second pair of active regions defined by the second trench.

* * * * *